(12) United States Patent
Noda

(10) Patent No.: US 6,744,658 B2
(45) Date of Patent: Jun. 1, 2004

(54) SEMICONDUCTOR MEMORY DEVICE CAPABLE OF HOLDING WRITE DATA FOR LONG TIME

(75) Inventor: Hideyuki Noda, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/378,852

(22) Filed: Mar. 5, 2003

(65) Prior Publication Data

US 2004/0052102 A1 Mar. 18, 2004

(30) Foreign Application Priority Data

Sep. 13, 2002 (JP) ......................................... 2002-267803

(51) Int. Cl.⁷ ............................................. G11C 11/24
(52) U.S. Cl. ........................................ 365/149; 365/145
(58) Field of Search ................................. 365/145, 149

(56) References Cited

U.S. PATENT DOCUMENTS

| 4,896,293 A | * | 1/1990 | McElroy ...................... 365/149 |
| 6,636,454 B2 | * | 10/2003 | Fujino et al. .......... 365/230.08 |
| 2002/0141226 A1 | * | 10/2002 | Kato et al. ................... 365/149 |

FOREIGN PATENT DOCUMENTS

JP        5-304271        11/1993

* cited by examiner

Primary Examiner—Son Mai
(74) Attorney, Agent, or Firm—Leydig, Voit & Mayer, Ltd.

(57) ABSTRACT

A semiconductor memory device includes memory cells. Each memory cell includes three P-channel MOS transistors. The first P-channel MOS transistor is connected between a bit line and a node, and receives on its gate terminal a voltage on a word line. The second P-channel MOS transistor has source and drain terminals connected to the node, and receives a cell plate voltage on its gate terminal. The third P-channel MOS transistor has a gate terminal connected to the node, and receives a cell plate voltage on its source and drain terminals.

9 Claims, 21 Drawing Sheets

F I G. 2
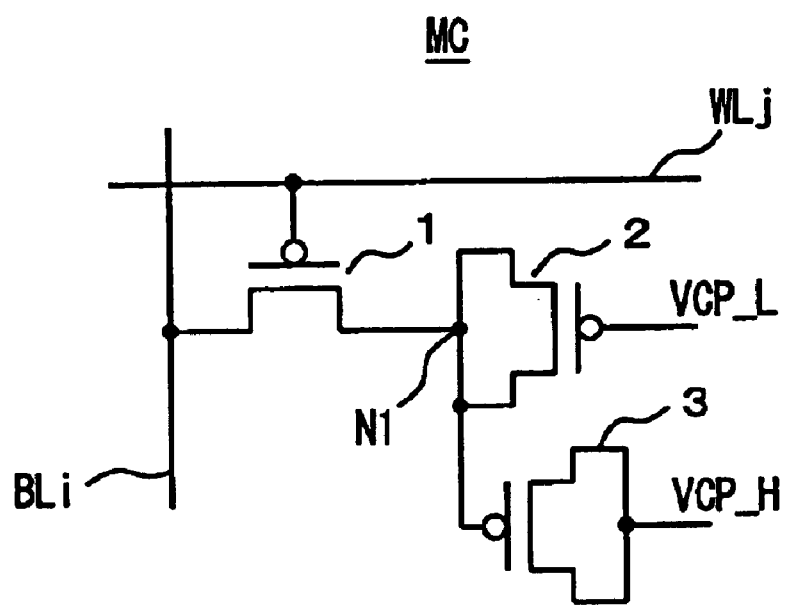

US 6,744,658 B2

SEMICONDUCTOR MEMORY DEVICE CAPABLE OF HOLDING WRITE DATA FOR LONG TIME

BACKGROUND OF THE INVENTION

1. Field of the Invention

The present invention relates to a semiconductor memory device, and particularly to a semiconductor memory device, which has a long refresh cycle, and can accurately amplify data read from a memory cell.

2. Description of the Background Art

For providing an on-chip large-scale memory in a system LSI (Large Scale Integration), it is necessary to fabricate a memory portion by a CMOS (Complementary MOS) logic process for suppressing increase in cost and preventing lowering of a performance of a logic circuit.

An SRAM (Static Random Access Memory) is a kind of memory, which can be fabricated by the CMOS logic process. However, various problems arise if the capacity of the SRAM is increased.

First, if the SRAM employs memory cells formed of the CMOS, one memory cell requires six transistors, and therefore occupies a large area. Therefore, increase in capacity results in increase in area of the whole system chip, and therefore results in increase in cost and lowering of yield.

As a result of miniaturization in the CMOS process, a non-negligible off-leakage current occurs in the transistors of the memory cell, and standby current unavoidably increases.

In view of the above problems, a planar DRAM (Dynamic Random Access Memory), which can be fabricated by the CMOS logic process, may be used. The planar DRAM has a smaller area than the SRAM, and periodically requires a smaller refresh current so that the standby current can be smaller than that of the SRAM, and thus the planar DRAM is very useful.

Referring to FIG. 17, a memory cell 200 in a planar DRAM is formed of P-channel MOS transistors 201 and 202. P-channel MOS transistor 201 is connected between a bit line BLi (i: natural number satisfying ($0 \leq i \leq m$), where m is a natural number) and a node NS. P-channel MOS transistor 201 has a gate terminal connected to a word line WLj (j: natural number satisfying ($0 \leq j \leq n$), where n is a natural number).

P-channel MOS transistor 202 has source and drain terminals connected to a node NS, and receives on its gate terminal a cell plate voltage VCP formed of a ground voltage GND.

Word line WLj carries a power supply voltage Vcc during standby, and carries ground voltage GND when it is active.

When word line WLj is active, P-channel MOS transistor 201 is on so that data is sent to or from a channel region (i.e., node NS) of P-channel MOS transistor 202 via P-channel MOS transistor 201.

FIG. 18 shows a layout of memory cells of a planar DRAM. Referring to FIG. 18, active regions 203 and 204 are formed on a deeper side of a sheet of FIG. 18. A cell plate 205 and word lines WLj−1 and WLj are formed on active region 203. A cell plate 206 is formed over both active regions 203 and 204, and a cell plate 207 and word lines WLj+1 and WLj+2 are formed on active region 204. A bit line pair BLi and /BLi is formed in a direction perpendicular to word lines WLj−1–WLj+2. A contact 208 is formed between word lines WLj−1 and WLj for connecting bit line BLi to a source terminal of a transistor formed under word line WLj. Also, a contact 209 is formed between word lines WLj+1 and WLj+2 for connecting bit line /BLi to a source terminal of a transistor formed under word line WLj+1.

FIG. 19 is a cross section of a region 210 shown in FIG. 18. Referring to FIG. 19, an N-well 221 is formed at a surface layer of a p-type silicon substrate 220. P$^+$diffusion layers 222 and 223 are formed at portions of N-well 221. A gate 224 is formed on N-well 221 located between P$^+$diffusion layers 222 and 223. Word line WLj is formed on gate 224.

A gate 225 is formed on N-well 221 neighboring to P$^+$diffusion layer 223, and a cell plate 204 is formed on gate 225. Contact 208 is formed on P$^+$diffusion layer 222, and connects bit line BLi to P$^+$diffusion layer 222. Insulating portion 208A is formed at N-well 221 of the region neighboring to gate 225. Insulating portion 208A is used for element isolation.

P$^+$diffusion layers 222 and 223 as well as gate 224 form P-channel MOS transistor 201, and P$^+$diffusion layers 223 and gate 225 form P-channel MOS transistor 202.

Cell plate 204 is supplied with cell plate voltage VCP formed of ground voltage GND. Therefore, an inverted layer 226 is formed at the surface of N-well 221 under cell plate 204 when positive charges are accumulated as a result of writing of H-data.

Referring to FIG. 20, an operation of writing H-data will now be described. The "H-data" means data written with a high voltage. When the voltage on word line WLj lowers from power supply voltage Vcc to ground voltage GND, word line WLj becomes active so that P-channel MOS transistor 201 is turned on. Positive charges forming the H-data on bit line BLi flow through P$^+$diffusion layer 222 and the channel region into P$^+$diffusion layer 223. Since ground voltage GND is placed on cell plate 204, a sufficient potential difference is present between P$^+$diffusion layer 223 and cell plate 204 so that a large amount of positive charges flow from P$^+$diffusion layer 223 into the channel region of P-channel MOS transistor 202. Consequently, inverted layer 226 is formed at the channel region of P-channel MOS transistor 202. Therefore, the H-data can be easily written into the memory cell of the planar type. When the H-data is written into the memory cell, the memory cell has a large cell capacity.

Referring to FIG. 21, an operation of writing L-data will now be described. The "L-data" means data written with a low voltage. When the voltage on word line WLj lowers from power supply voltage Vcc to ground voltage GND, word line WLj becomes active so that P-channel MOS transistor 201 is turned on. Negative charges forming the L-data on bit line BLi flow through contact 208 into P$^+$diffusion layer 222. The negative charges in P$^+$diffusion layer 222 do not sufficiently flow into P$^+$diffusion layer 223 through the channel region of P-channel MOS transistor 201 due to a threshold loss in P-channel MOS transistor 201. Since the voltage placed on cell plate 204 is ground voltage GND, a sufficient potential difference does not occur between P$^+$diffusion layer 223 and cell plate 204, and an amount of negative charges flowing from P$^+$diffusion layer 223 into the channel region of P-channel MOS transistor 202 is small. Consequently, inverted layer 226 is not formed at the surface of N-well 221 under cell plate 204. As described above, the cell capacity of the memory cell carrying the L-data is very small.

Description will now be given on an operation of reading data from the memory cell of the planar type. Immediately before the read operation, bit line pair BLi and /BLi is precharged to carry a precharge voltage Vcc/2. When the voltage on word line WLj lowers from power supply voltage Vcc to ground voltage GND, word line WLj becomes active so that P-channel MOS transistor 201 is turned on. The charges held in P-channel MOS transistor 202 flow to bit line BLi through P-channel MOS transistor 201 and contact 208, and the voltage on bit line BLi slightly changes from precharge voltage Vcc/2 in accordance with the logical level of read data.

More specifically, the voltage on bit line BLi changes from precharge voltage Vcc/2 to a voltage of (Vcc/2+ΔV) when the memory cell has stored H-data. When the memory cell has stored L-data, the voltage on bit line BLi changes from precharge voltage Vcc/2 to a voltage of (Vcc/2−ΔV).

The data read onto bit line BLi is amplified by a sense amplifier SA. Referring to FIG. 22, sense amplifier SA includes P-channel MOS transistors 227–229 and N-channel MOS transistors 230–232. P-channel MOS transistor 227 is connected between a power supply node NVC and a node N5. P-channel MOS transistor 227 receives on its gate a signal /SOP.

P-channel MOS transistor 228 and N-channel MOS transistor 230 are connected in series between nodes N5 and N8. P- and N-channel MOS transistors 229 and 231 are connected in series between nodes N5 and N8. P- and N-channel MOS transistors 228 and 230 are connected in parallel to P- and N-channel MOS transistors 229 and 231.

P- and N-channel MOS transistors 228 and 230 receive on their gate terminals a voltage placed on a node N7. P- and N-channel MOS transistors 229 and 231 receive on their gate terminals a voltage placed on a node N6.

N-channel MOS transistor 232 is connected between node N8 and ground node GND. N-channel MOS transistor 232 receives a signal SON on its gate terminal. Bit line BLi is connected to node N6 located between P- and N-channel MOS transistors 228 and 230. Bit line /BLi is connected to node N7 located between P- and N-channel MOS transistors 229 and 231.

Sense amplifier SA becomes active when it receives signal /SOP at L-level and signal SON at H-level.

Referring to FIG. 23, description will now be given on an operation of sense amplifier SA. Before reading the data from the memory cell, bit line pair BLi and /BLi is precharged to carry precharge voltage Vcc/2. When the voltage on word line WLj lowers from power supply voltage Vcc to ground voltage GND, word line WLj becomes active so that the H-data is read from the memory cell onto bit line BLi. The voltage on bit line BLi changes from precharge voltage Vcc/2 to a voltage of (Vcc/2+ΔV). In this case, the voltage on bit line /BLi remains at precharge voltage Vcc/2.

In sense amplifier SA, P- and N-channel MOS transistors 229 and 231 receive the voltage of (Vcc/2+ΔV) on their gate terminals, and P- and N-channel MOS transistors 228 and 230 receive precharge voltage Vcc/2 on their gate terminals.

Since P-channel MOS transistor 228 receives on its gate terminal a voltage lower than that received by P-channel MOS transistor 229, P-channel MOS transistor 228 is turned on, and the voltage on node N6 rises from the voltage of (Vcc/2+ΔV) to power supply voltage Vcc. Thereby, P-channel MOS transistor 229 is turned off, and N-channel MOS transistor 231 is turned on so that the voltage on node N7 lowers from precharge voltage Vcc/2 to ground voltage GND. N-channel MOS transistor 230 is turned off.

In this manner, sense amplifier SA raises the voltage on bit line BLi from voltage (Vcc/2+ΔV) to power supply voltage Vcc, and lowers the voltage on bit line /BLi from precharge voltage Vcc/2 to ground voltage GND. Thus, sense amplifier SA amplifies the H-data read onto bit line BLi.

When L-data is read from the memory cell onto bit line BLi, the voltage on bit line BLi changes from precharge voltage Vcc/2 to the voltage of (Vcc/2−ΔV). In this case, the voltage on bit line /BLi remains at precharge voltage Vcc/2.

In sense amplifier SA, P- and N-channel MOS transistors 229 and 231 receive the voltage of (Vcc/2−ΔV) on their gate terminals, and P- and N-channel MOS transistors 228 and 230 receive precharge voltage Vcc/2 on their gate terminals.

Since P-channel MOS transistor 229 receives on its gate terminal the voltage lower than that received by P-channel MOS transistor 228, P-channel MOS transistor 229 is turned on, and the voltage on node N7 rises from precharge voltage Vcc/2 to power supply voltage Vcc. Thereby, P-channel MOS transistor 228 is turned off, and N-channel MOS transistor 230 is turned on so that the voltage on node N6 lowers from the voltage of (Vcc/2−ΔV) to ground voltage GND. N-channel MOS transistor 231 is turned off.

As described above, sense amplifier SA lowers the voltage on bit line BLi from the voltage of (Vcc/2−ΔV) to ground voltage GND, and raises the voltage on bit line /BLi from precharge voltage Vcc/2 to power supply voltage Vcc. Thus, sense amplifier SA amplifies the L-data read onto bit line BLi.

As described above, the data read from the memory cell of the planar type is amplified by sense amplifier SA.

However, the sense amplifier SA can amplify the read data only in such a case that a potential difference, which can be amplified by sense amplifier SA, occurs between bit lines BLi and /BLi when the data is read from the memory cell onto bit line BLi or /BLi. Thus, the sense amplifier SA can amplify the read data only when the memory cell holds the charges corresponding to the written data.

As described above, the H-data can be easily written into the memory cell of the planar type, and the memory cell holding the H-data has a large cell capacity. Therefore, when the H-data is read from the memory cell, a potential difference ΔV0, which can be amplified by sense amplifier SA, occurs between bit lines BLi and /BLi as illustrated in FIG. 24.

However, it is difficult to write the L-data into the memory cell of the planar type, and the cell capacity is small in the memory cell holding the L-data. Therefore, when the L-data is read from the memory cell, a potential difference ΔV2, which cannot be amplified by sense amplifier SA without difficulty, occurs between bit lines BLi and /BLi, as illustrated in FIG. 25. Thus, a potential difference required for a reliable sense operation cannot be produced when the L-data is written in the memory cell of the conventional planar type.

For writing the L-data into the memory cell of the planar type so that a potential difference required for the reliable sense operation may be produced, the voltage applied to gate 224 of P-channel MOS transistor 201 must be set to −0.4 V (nearly equal to the threshold voltage of P-channel MOS transistor 201) lower than ground voltage GND of 0 V, and the voltage of −0.4 V must be applied also to cell plate 204.

However, the voltage (−0.4 V) lower than the ground voltage GND of the silicon substrate cannot be used in the twin well structure without difficulty, and also increases power consumption.

Therefore, the memory cell of the conventional planar type suffers from such a problem that the potential difference required for the reliable sense operation cannot be obtained easily.

The memory cell of the planar type holds information based on the amount of charges, but the amount of accumulated charges decreases due to a leak current with time. Referring to FIG. 26, a gate leak current 233 is most dominant among leaks currents, and a junction leak current 234 is secondarily dominant.

Gate leak current 233 occurs due to the fact that a gate oxide film forming gate 225 is thin. Gate leak current 233 flows when charges leak from $P^+$diffusion layer 223 forming the storage node to cell plate 204. Therefore, when $P^+$diffusion layer 223 accumulates the charges corresponding to the H-data, gate leak current 233 becomes remarkable.

The junction leak current 234 is a reverse-direction junction current occurring between N-well 221 under the memory cell and $P^+$diffusion layer 223 forming the storage node. Junction leak current 234 becomes particularly remarkable when $P^+$diffusion layer 223 accumulates the charges corresponding to the L-data.

Accordingly, the potential on $P^+$diffusion layer 223 forming the storage node changes as illustrated in FIG. 27. When the H-data is written into the memory cell, $P^+$diffusion layer 223 initially carries a sufficiently high potential of power supply voltage Vcc. As the time elapses, gate leak current 233 occurs, and the potential on $P^+$diffusion layer 223 rapidly lowers.

When the L-data is written into the memory cell, $P^+$diffusion layer 223 initially carries a potential Vthp raised by threshold voltage Vthp of P-channel MOS transistor 201. Thereafter, a junction leak current 234 occurs as the time elapses so that the potential on $P^+$diffusion layer 223 rises. When the potential on $P^+$diffusion layer 223 rises to a certain extent, gate leak current 233 increases so that the rising of the potential stops.

In the memory cell of the planar type, as described above, gate leak current 233 is large, and the data holding time depends on the degree of deterioration of H-data so that the refresh operation must be performed frequently, resulting in increase in power consumption.

SUMMARY OF THE INVENTION

Accordingly, an object of the invention is to provide a semiconductor memory device, which can operate with a long refresh cycle, and can accurately amplify data read from a memory cell.

According to the invention, a semiconductor memory device includes a plurality of memory cells and a peripheral circuit. The plurality of memory cells are arranged in rows and columns. The peripheral circuit can provide data into and from each of the plurality of memory cells.

Each of the plurality of memory cells includes a capacity element for storing the data, and the capacity element is formed of first and second elements. The first and second elements accumulate charges corresponding to first write data and second write data different from said first write data, respectively.

According to the invention, therefore, a sufficient potential difference can be produced on a bit line pair in both the cases where first data is read from the memory cell, and where second data is read therefrom.

Further, the data holding time of the memory cell can be significantly longer than that of a memory cell of a conventional planar type, and the number of refresh operations per time can be significantly reduced. This can significantly reduce power consumption.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a circuit diagram of a memory cell shown in FIG. 1;

DESCRIPTION OF THE PREFERRED EMBODIMENTS

Embodiments of the invention will now be described in detail with reference to the drawings. In the figures, the same or corresponding portions bear the same reference numbers, and description thereof is not repeated.

[First Embodiment]

Figure 1:
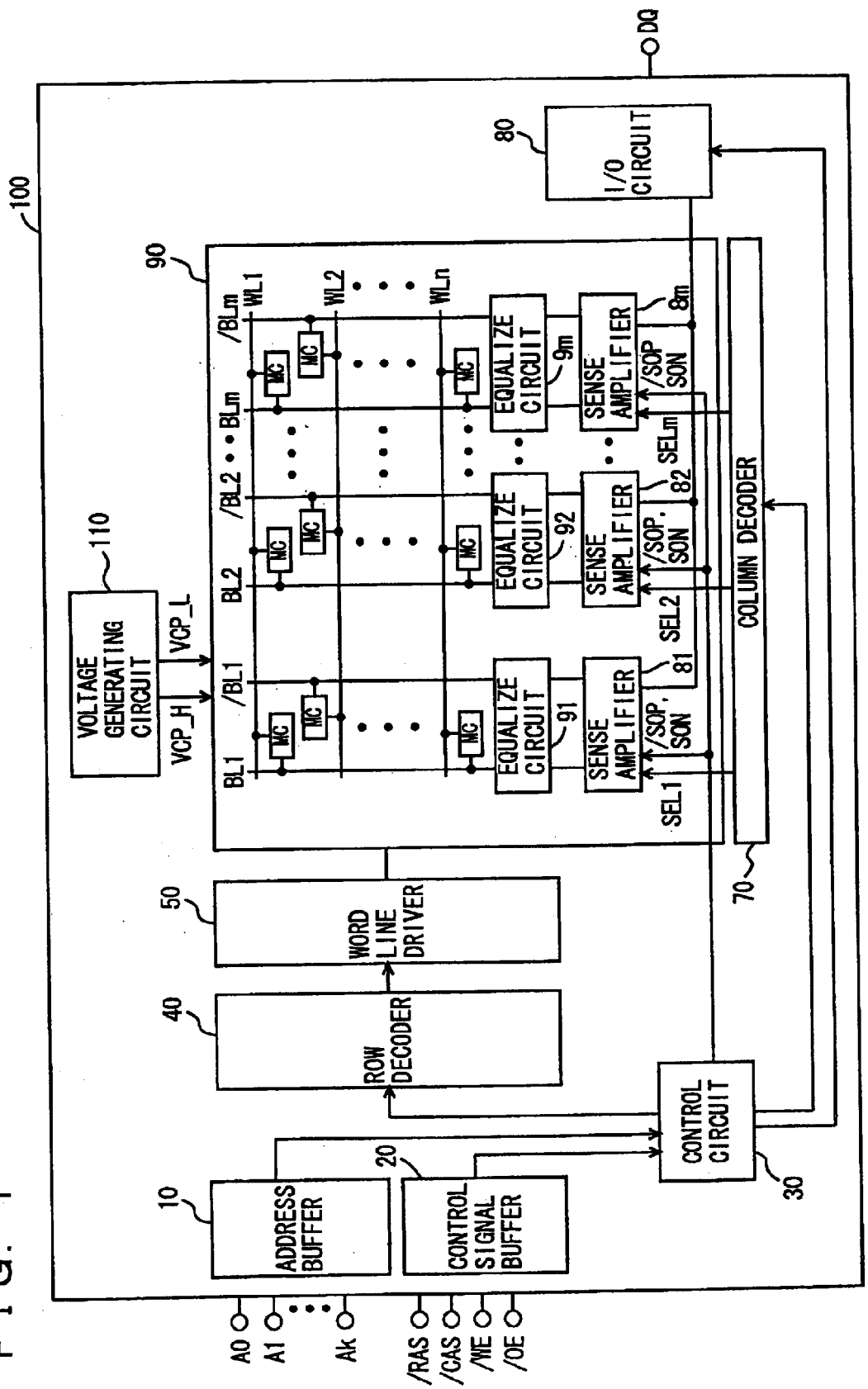
FIG. 1 is a schematic block diagram of a semiconductor memory device according to a first embodiment.

Referring to FIG. 1, a semiconductor memory device 100 according to a first embodiment includes an address buffer 10, a control signal buffer 20, a control circuit 30, a row decoder 40, a word line driver 50, a column decoder 70, an I/O circuit 80, a memory cell array 90 and a voltage generating circuit 110. More specifically, semiconductor memory device 100 is a DRAM.

Address buffer 10 externally receives addresses A0–Ak (k: natural number), and buffers received addresses A0–Ak. Address buffer 10 provides buffered addresses A0–Ak to control circuit 30.

Control signal buffer 20 receives and buffers control signals such as a row address strobe signal /RAS, a column address strobe signal /CAS, a write enable signal /WE and an output enable signal /OE. Control signal buffer 20 provides the control signals such as row address strobe signal /RAS thus buffered to control circuit 30.

Control circuit 30 provides addresses A0–Ak, which are received from address buffer 10, to row decoder 40 as a row address in accordance with timing of switching of row address strobe signal /RAS from H-level to L-level.

Also, control circuit 30 provides addresses A0–Ak, which are received from address buffer 10, to column decoder 70 as a column address in accordance with timing of switching of column address strobe signal /CAS from H-level to L-level.

Further, control circuit 30 recognizes a data write mode based on write enable signal /WE at L-level, and also recognizes a data read mode based on output enable signal /OE at L-level. When control circuit 30 recognizes the write mode, it controls I/O circuit 80 to provide the write data sent from an I/O terminal DQ to sense amplifiers 81–8m (m: natural number). When control circuit 30 recognizes the read mode, it controls I/O circuit 80 to provide the read data amplified by sense amplifiers 81–8m to I/O terminal DQ.

Further, control circuit 30 issues a signal /SOP at L-level and a signal SON at H-level to sense amplifiers 81–8m in the read mode.

Row decoder 40 decodes the row address sent from control circuit 30, and provides the decoded row address to word line driver 50. Word line driver 50 activates word line WLj designated by the decoded row address. More specifically, word line driver 50 activates word line WLj by lowering the voltage on word line WLj from power supply voltage Vcc to ground voltage GND.

Column decoder 70 decodes the column address sent from control circuit 30, and provides a select signal SELi for selecting sense amplifier 8i (1≦i≦m), which is designated by the decoded column address, to connect sense amplifier 8i to I/O circuit 80.

I/O circuit 80 provides the write data received from I/O terminal DQ to sense amplifier 8i, and provides the read data received from sense amplifier 8i to I/O terminal DQ.

Memory cell array 90 includes memory cells MC of (m×n (n: natural number)) in number, a plurality of bit line pairs BL1 and /BL1–BLm and /BLm, a plurality of word lines WL1–WLn, the plurality of sense amplifiers 81–8m and a plurality of equalize circuits 91–9m.

Memory cells MC of (m×n) in number are arranged in rows and columns. The plurality of bit line pairs BL1 and /BL1–BLm and /BLm are arranged in a column direction of memory cell array 90. The plurality of word lines WL1–WLn are arranged in the row direction of memory cell array 90.

The plurality of sense amplifiers 81–8m are arranged corresponding to the plurality of bit line pairs BL1 and /BL1–BLm and /BLm, respectively. When column decoder 70 connects sense amplifier 8i to I/O circuit 80, sense amplifier 8i writes the write data received from I/O circuit 80 onto corresponding bit line pair BLi and /BLi. Also, sense amplifier 8i amplifies the read data read from corresponding bit line pair BLi and /BLi, and provides it to I/O circuit 80 when sense amplifier 8i is connected to I/O circuit by column decoder 70.

The plurality of equalize circuits 91–9m are provided corresponding to the plurality of bit line pairs BL1 and /BL1–BLm and /BLm, respectively. Before the operation of writing or reading data into or from memory cells MC, the plurality of equalize circuits 91–9m precharge corresponding bit line pairs BLi and /BLi to a precharge voltage Vcc/2, respectively.

The voltage generating circuit 110 generates cell plate voltages VCP_H and VCP_L, and provides these cell plate voltages VCP_H and VCP_L to (m×n) memory cells MC in memory cell array 90. Cell plate voltage VCP_H is formed of power supply voltage Vcc, and cell plate voltage VCP_L is formed of ground voltage GND.

Referring to FIG. 2, memory cell MC is formed of P-channel MOS transistors 1–3. P-channel MOS transistor 1 is connected between bit line BLi and a node N1, and receives on its gate terminal the voltage placed on word line WLj.

P-channel MOS transistor 2 has source and drain terminals connected to node N1, and receives cell plate voltage VCP_L from voltage generating circuit 110 on its gate terminal.

P-channel MOS transistor 3 has a gate terminal connected to node N1, and receives cell plate voltage VCP_H from voltage generating circuit 110 on its source and drain terminals.

Figure 3:
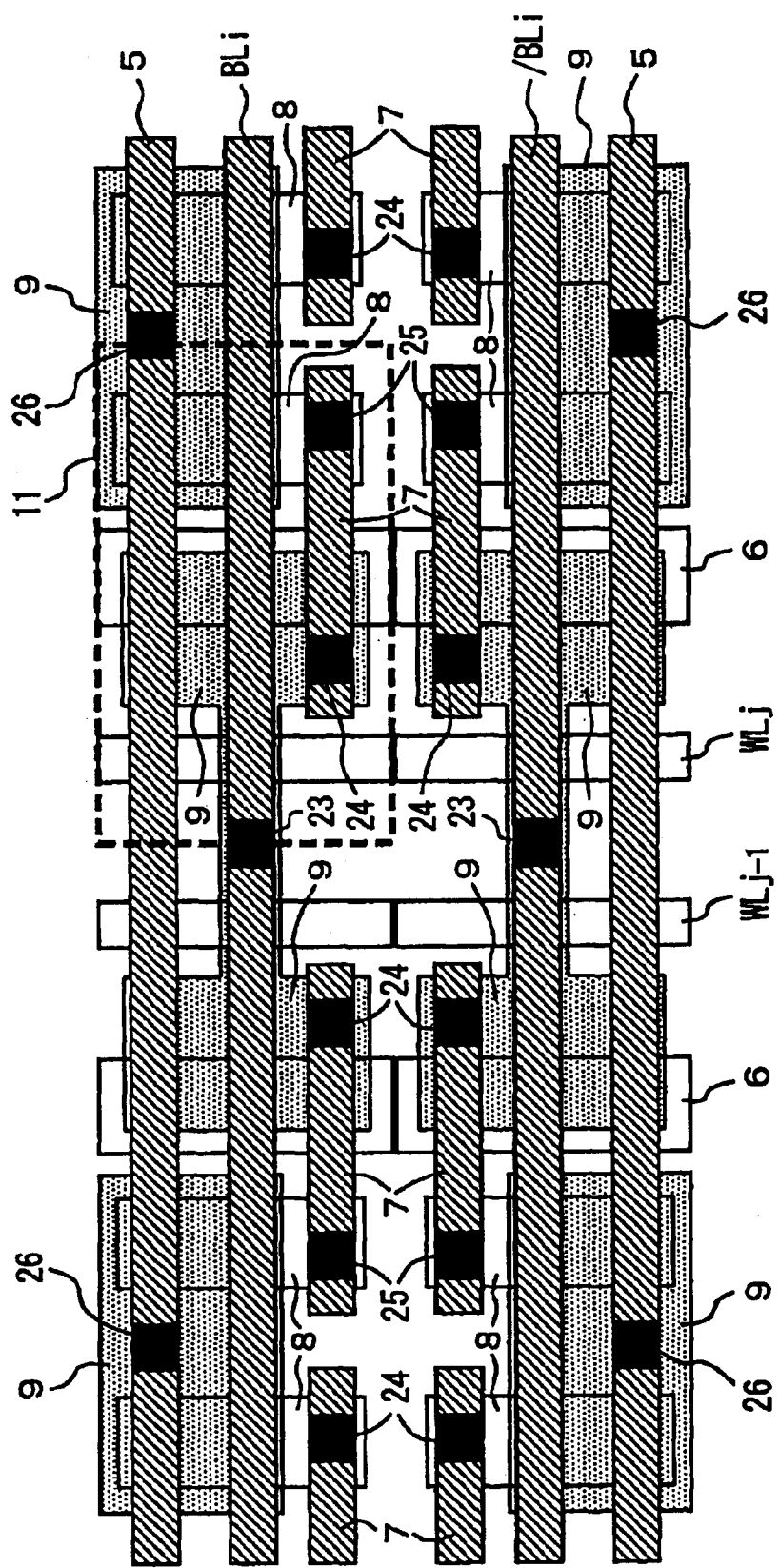
FIG. 3 is a plan of the memory cells shown in FIG. 1.

Referring to FIG. 3, description will now be given on a planar layout of memory cells MC. A plurality of active regions 9 are formed, and gates (not shown) are formed on active regions 9. Word lines WLj−1 and WLj as well as interconnections 6 and cell plates 8 are formed on the gates. Interconnection 6 is provided for transmitting cell plate voltage VCP_L to be applied to the gate terminal of P-channel MOS transistor 2.

Above word lines WLj−1 and WLj, bit lines BLi and /BLi as well as interconnections 5 and 7 are formed in the direction perpendicular to word lines WLj−1 and WLj. Interconnections 5 are provided for transmitting cell plate voltage VCP_H to be applied to the source and drain terminals of P-channel MOS transistor 3. Interconnections 7 are provided for connecting the source and drain terminals of P-channel MOS transistor 2 to the gate terminal of P-channel MOS transistor 3.

Further, contacts 23–26 are formed. Contact 23 is provided for connecting bit line BLi to the source terminal of P-channel MOS transistor 1. Contact 24 is provided for connecting interconnection 7 to node N1. Contact 25 is provided for connecting interconnection 7 to cell plate 8 of P-channel MOS transistor 3. Contact 26 is provided for connecting interconnection 5 to the source and drain terminals of P-channel MOS transistor 3.

Figure 4:
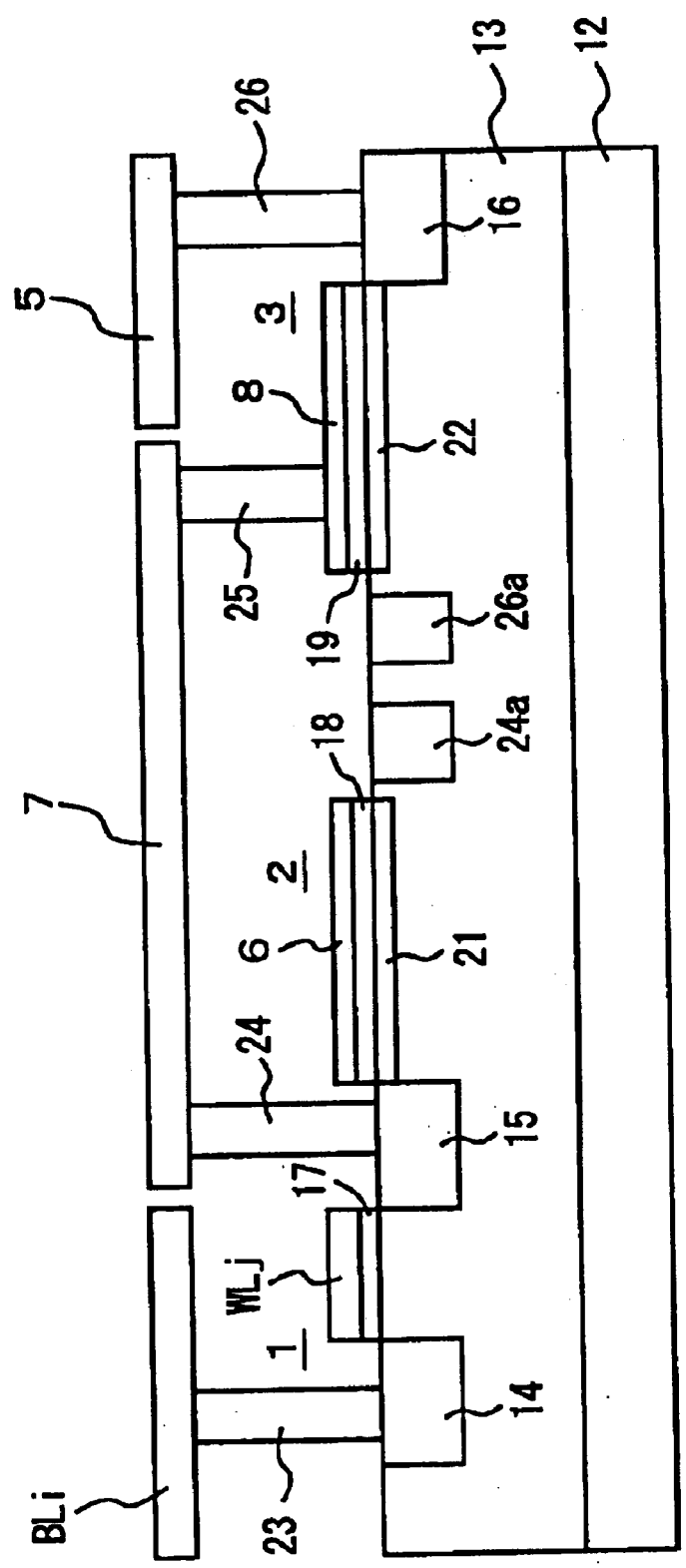
FIG. 4 is a cross section of a region of one memory cell shown in FIG. 3.

Referring to FIG. 4, a sectional structure in a region 11 shown in FIG. 3 will now be described. An N-well 13 is formed at a surface of a p-type silicon substrate 12. P$^+$diffusion layers 14–16 are formed at the surface of N-well 13.

A gate 17 is formed between P$^+$diffusion layers 14 and 15, and word line WLj is formed on gate 17. P$^+$diffusion layer 14 is connected to bit line BLi via contact 23. P$^+$diffusion layers 14 and 15 as well as gate 17 form P-channel MOS transistor 1.

A gate 18 is formed on N-well 13 located between P$^+$diffusion layer 15 and a contact 24a, and interconnection 6 is formed on gate 18. Since interconnection 6 transmits cell plate voltage VCP_L (equal to ground voltage GND), an inverted layer 21 is formed under gate 18. P$^+$diffusion layer 15, contact 24a and gate 18 form P-channel MOS transistor 2. Contact 24 connects P$^+$diffusion layer 15 to interconnection 7. Contact 24a is connected to interconnection 7 in an appropriate manner (not shown).

A gate 19 is formed on N-well 13 located between P$^+$diffusion layer 16 and a contact 26a, and cell plate 8 is formed on gate 19. Contact 25 connects cell plate 8 to interconnection 7. When P+diffusion layer 15 carries a negative potential, the negative potential is applied to cell plate 8 via contact 24, interconnection 7 and contact 25. In this case, therefore, an inverted layer 22 is formed under gate 19. P+diffusion layer 16, contact 26a and gate 19 form P-channel MOS transistor 3. Contact 26a is connected to interconnection 5 in an appropriate manner (not shown).

Figure 5:
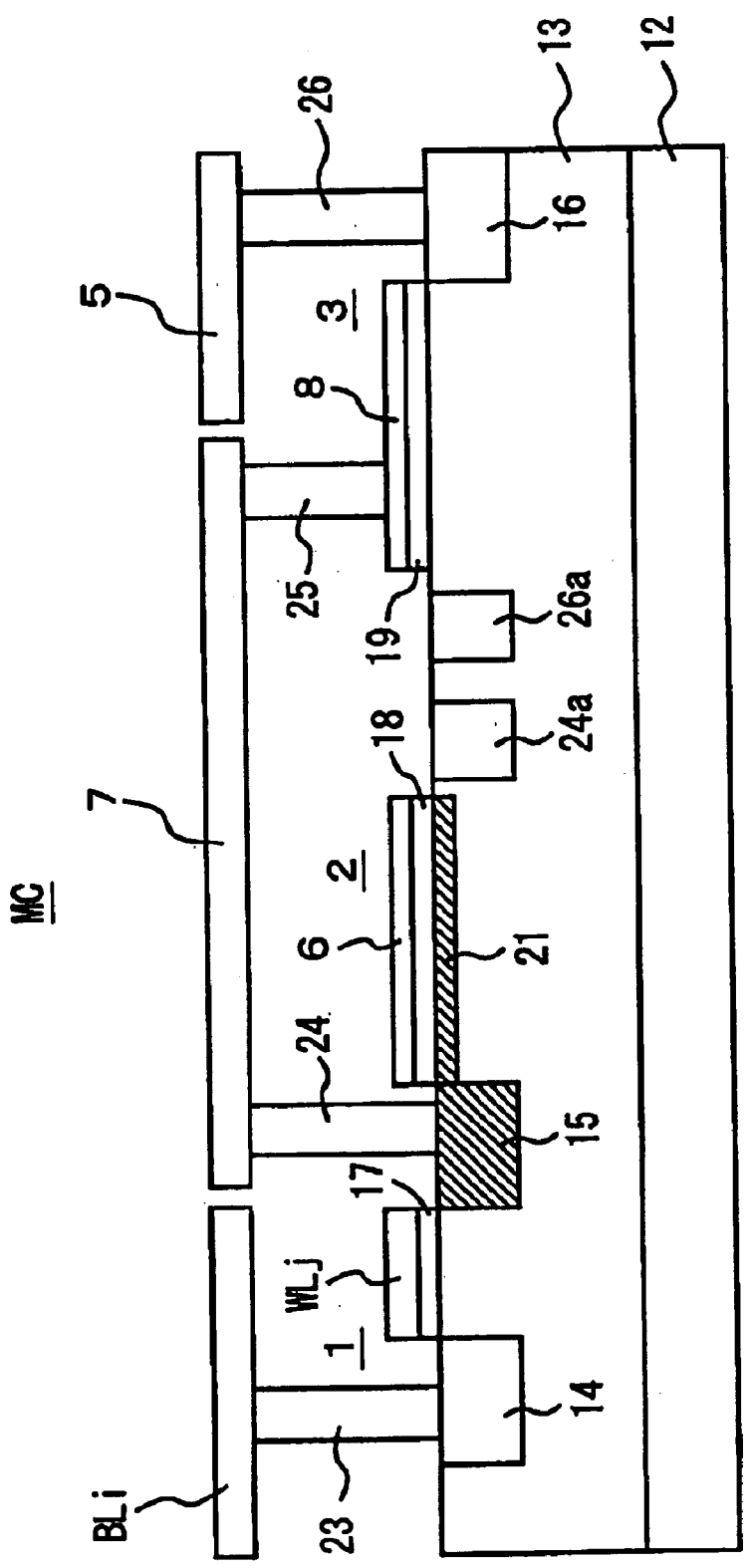
FIGS. 5 to 8 are respective cross sections of the memory cell.

Referring to FIG. 5, description will now be given on the writing of H-data into memory cell MC. For writing the data, the voltage on word line WLj lowers from power supply voltage Vcc to ground voltage GND, and P-channel MOS transistor 1 is turned on.

Thereby, the positive charges forming the H-data are accumulated in P+diffusion layer 15 via contact 23, P+diffusion layer 14 and the channel region of P-channel MOS transistor 1.

Since cell plate voltage VCP_L formed of ground voltage GND is applied to interconnection 6 on gate 18 of P-channel MOS transistor 2, inverted layer 21 is formed under gate 18, and positive charges accumulated in P+diffusion layer 15 flow into inverted layer 21, and are held therein. In P-channel MOS transistor 2, the cell capacity provided by the opposite sides of gate 18 has a magnitude enough to hold the H-data.

When P+diffusion layer 15 accumulates the positive charges, a positive potential is applied to cell plate 8 of P-channel MOS transistor 3 via contact 24, interconnection 7 and contact 25 so that an inverted layer is not formed under gate 19 in P-channel MOS transistor 3.

As described above, H-data is held in P-channel MOS transistor 2 of memory cell MC.

Figure 6:
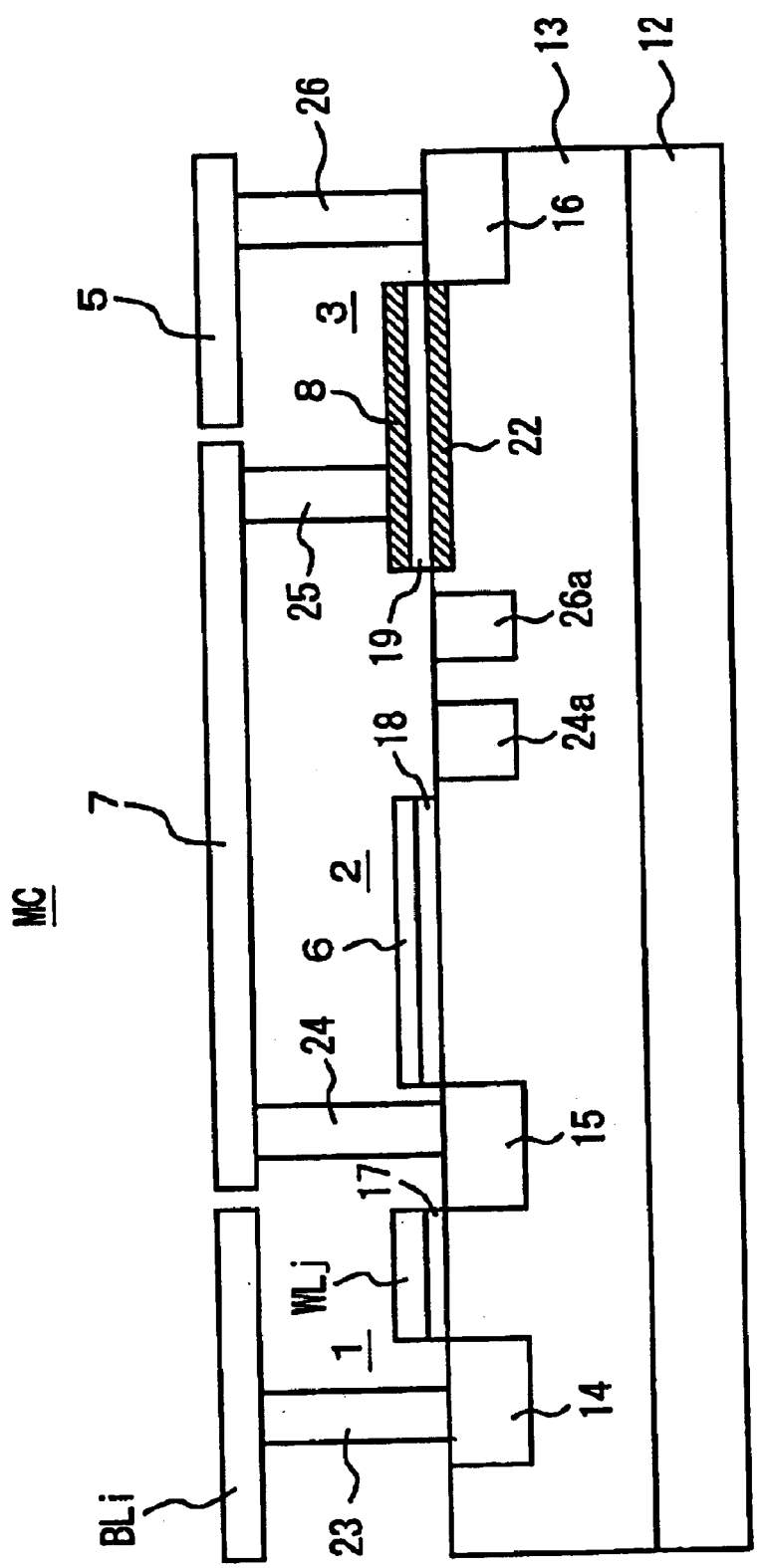

Referring to FIG. 6, writing of L-data into memory cell MC will now be described. In this case, the voltage on word line WLj changes from power supply voltage Vcc to ground voltage GND, and P-channel MOS transistor 1 is turned on. Thereby, P+diffusion layer 15 accumulates negative charges forming the L-data via bit line BLi, contact 23, P+diffusion layer 14 and the channel region of P-channel MOS transistor 1. Since interconnection 6 carries cell plate voltage VCP_L formed of ground voltage GND, the negative charges accumulated in P+diffusion layer 15 do not sufficiently flow into the channel region under gate 18 of P-channel MOS transistor 2. Consequently, an inverted layer is not formed under gate 18 to an extent enough to hold the L-data.

Since P+diffusion layer 16 carries cell plate voltage VCP_H formed of power supply voltage Vcc via interconnection 5 and contact 26, positive charges flow into the channel region of P-channel MOS transistor 3, and the negative charges accumulated in P+diffusion layer 15 flow into cell plate 8 via contact 24, interconnection 7 and contact 25 so that inverted layer 22 is formed under gate 19. In P-channel MOS transistor 3, the cell capacity provided by the opposite sides of gate 19 has a magnitude enough to hold the L-data.

As described above, the L-data is held in cell plate 8 (gate terminal) of P-channel MOS transistor 3 of memory cell MC.

Figure 7:
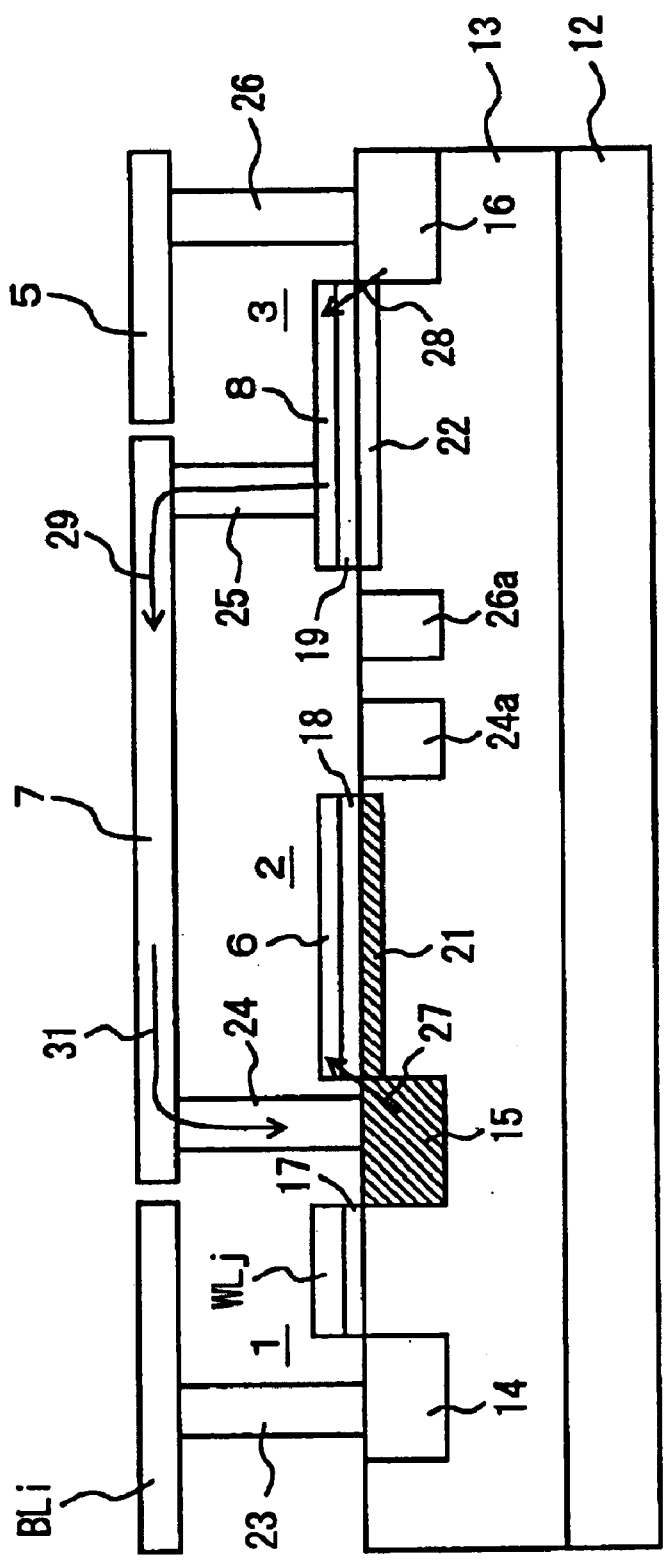
Figure 8:
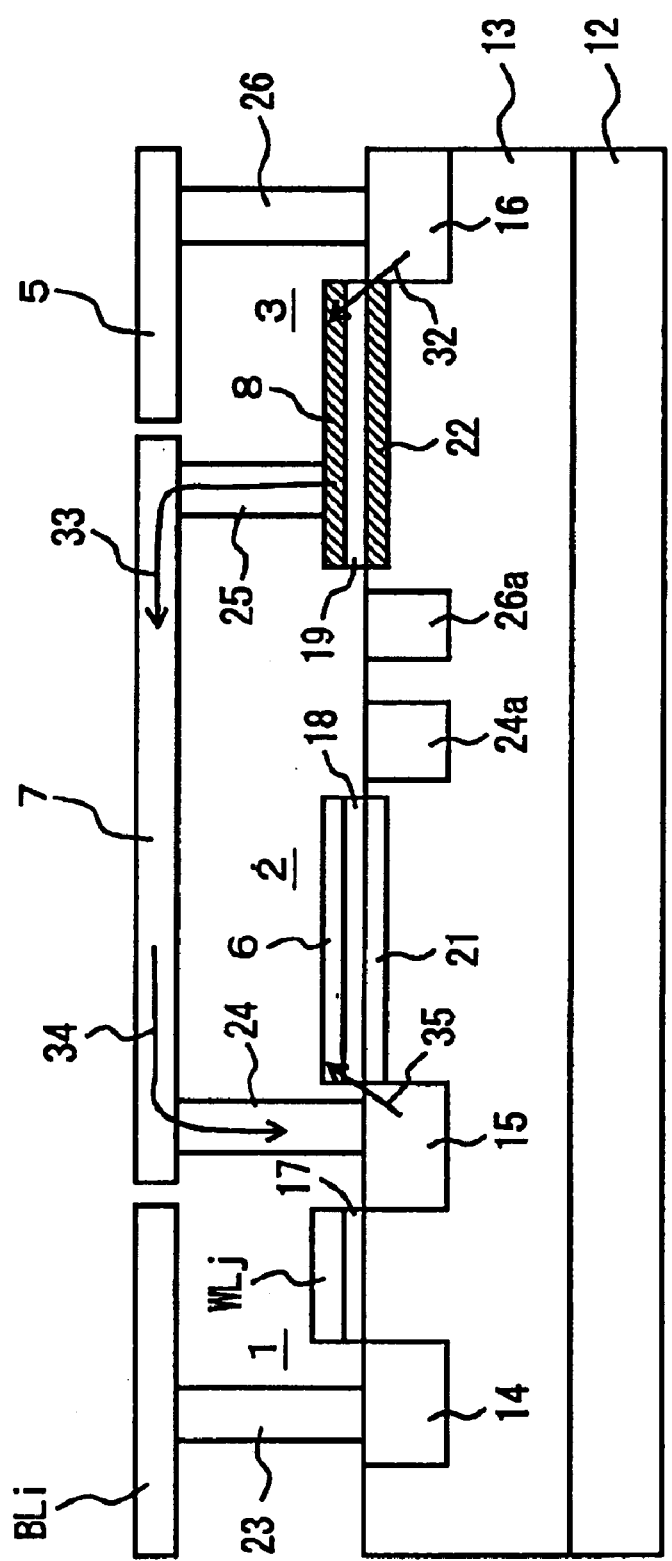
Figure 9:
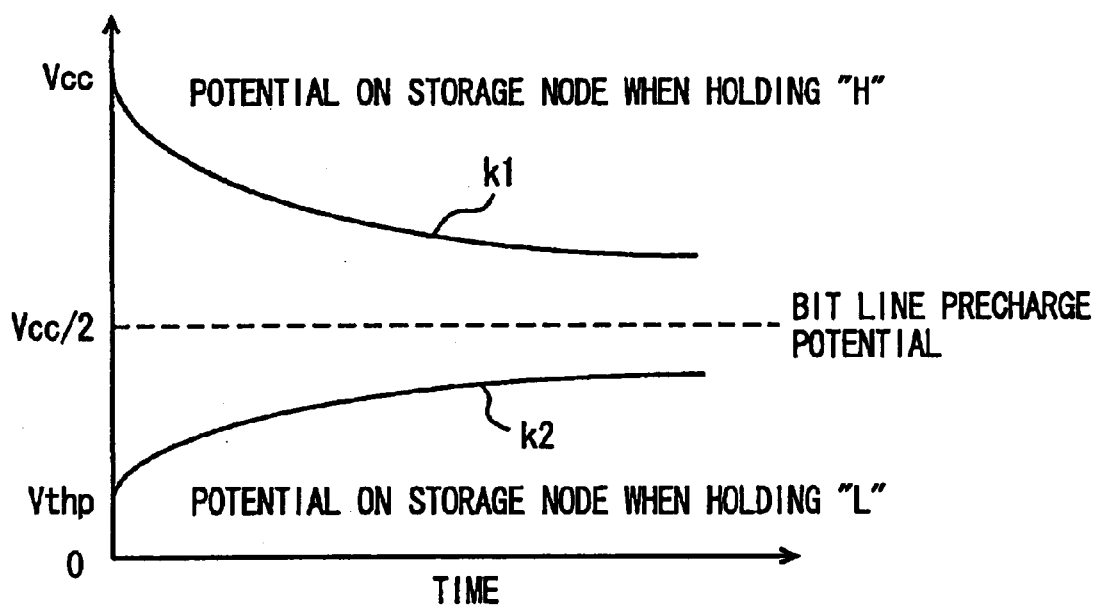
FIG. 9 illustrates H- and L-data holding characteristics.

Referring to FIGS. 7 to 9, H- or L-data written into memory cell MC is held as described below. Referring to FIG. 7, when H-data is written into memory cell MC, positive charges forming the H-data are held by P-channel MOS transistor 2 of memory cell MC as already described. In P-channel MOS transistor 2, a gate leak current 27 caused by leakage of the positive charges from P+diffusion layer 15 to gate 18 becomes dominant so that the positive charges held in P-channel MOS transistor 2 decrease.

However, cell plate voltage VCP_H formed of power supply voltage Vcc is applied to P+diffusion layer 16 of P-channel MOS transistor 3, and therefore a gate leak current 28 flowing from P+diffusion layer 16 to cell plate 8 via gate 19 becomes dominant in P-channel MOS transistor 3. Thereby, gate leak current 28 flows from cell plate 8 into P+diffusion layer 15 of P-channel MOS transistor 2 via contact 25, interconnection 7 and contact 24 as indicated by arrows 29 and 31. Therefore, even when gate leak current 27 reduces the positive charges accumulated in P+diffusion layer 15, gate leak current 28 caused in P-channel MOS transistor 3 refills the charges to compensate partially for the reduction. Consequently, the amount of positive charges, which form the H-data written into memory cell MC and are held by memory cell MC, depends on a balance between the amount of charges reduced by gate leak current 27 and the amount of charges refilled by gate leak current 28.

Referring to FIG. 8, when L-data is written into memory cell MC, negative charges forming the L-data are held by P-channel MOS transistor 3 of memory cell MC as already described. In P-channel MOS transistor 3, a gate leak current 32 caused by leakage of the positive charges from P+diffusion layer 16 to cell plate 8 via gate 19 becomes dominant, and the negative charges held by cell plate 8 of P-channel MOS transistor 3 decrease.

However, gate leak current 32 flows from cell plate 8 into P+diffusion layer 15 of P-channel MOS transistor 2 via contact 25, interconnection 7 and contact 24 as indicated by arrows 33 and 34. When the positive charges flowing into P+diffusion layer 15 increase, a gate leak current 35 leaking from P+diffusion layer 15 via gate 18 to interconnection 6 becomes dominant in P-channel MOS transistor 2. Thereby, the positive charges in P+diffusion layer 15 decrease. This means that the negative charges accumulated in cell plate 8 are reduced by gate leak current 32, but gate leak current 35 refills and partially compensates for such reduction. Thus, gate leak current 32 increases the positive charges flowing into cell plate 8, and the negative charges accumulated in cell plate 8 decrease. However, the positive charges flowing into cell plate 8 will finally arrive at interconnection 6 of P-channel MOS transistor 2 owing to gate leak current 35, and relatively increase the negative charges accumulated in cell plate 8.

Accordingly, even if the negative charges accumulated in cell plate 8 are reduced by gate leak current 32, gate leak current 35 caused in P-channel MOS transistor 2 partially compensates for such reduction. Consequently, the amount of the negative charges, which form the L-data written into memory cell MC and are held by memory cell MC, depends on a balance between the amount of charges reduced by gate leak current 32 and the amount of charges refilled by gate leak current 35.

According to memory cell MC of the planar type of the invention, as described above, when the H-data is written into memory cell MC, P-channel MOS transistor 2 holds the H-data, and P-channel MOS transistor 3 refills and compensates for reduction of the positive charges forming the H-data in P-channel MOS transistor 2. Further, when the L-data is written into memory cell MC, the L-data is held by P-channel MOS transistor 3, and P-channel MOS transistor 2 compensates for reduction of the negative charges forming the L-data in P-channel MOS transistor 3.

According to memory cell MC of the planar type of the invention, as described above, whichever data between H- and L-data is written, the decrease of the positive charges forming the H-data or the negative charges forming the L-data is partially compensated by the gate leak current occurring in the P-channel MOS transistor other than the P-channel MOS transistor holding such data.

Accordingly, memory cell MC of the planar type of the invention has such a feature that memory cell MC has a first capacity element holding the positive charges forming the H-data or the negative charges forming the L-data, and a second capacity element compensating for the reduction of the charges in the first capacity element.

Referring to FIG. 9, description will now be given on changes, which occur with time in positive or negative charges held in memory cell MC. When H-data is written into memory cell MC, the potential of the storage node (P$^+$diffusion layer 15) accumulating the positive charges forming the H-data is initially at the level of power supply voltage Vcc, then changes in accordance with a curve k1 as a result of the lowering by gate leak current 27 and raising by gate leak current 28, and finally approaches asymptotically precharge voltage Vcc/2 of bit line pair BLi and /BLi.

When the L-data is written into memory cell MC, the potential of the storage node (cell plate 8=P$^+$diffusion layer 15) accumulating the negative charges forming the L-data is initially at the level of voltage Vthp higher by threshold voltage Vthp of P-channel MOS transistor 1, then changes in accordance with a curve k2 as a result of raising by gate leak current 32 and lowering by gate leak current 35, and finally approaches asymptotically precharge voltage Vcc/2 of bit line pair BLi and /BLi.

In the case where the H- or L-data is written into memory cell MC, the positive charges forming the H-data or the negative charges forming the L-data decrease and asymptotically approach precharge voltage Vcc/2 of bit line pair BLi and /BLi.

Figure 27:
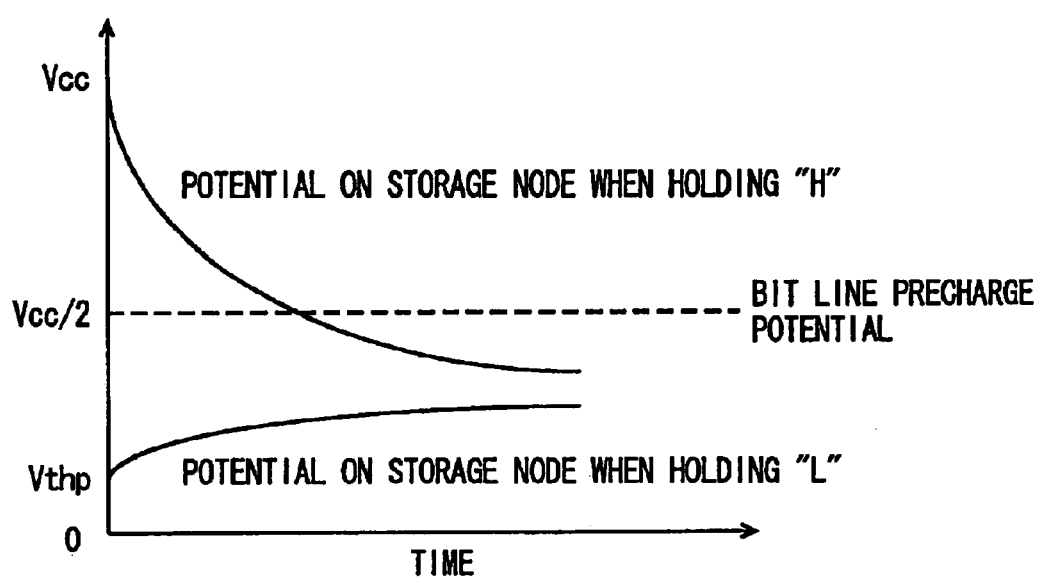
FIG. 27 illustrates data holding characteristics in the memory cell of the conventional planar type.

When L-data is written into the conventional memory cell of the planar type, the voltage on the storage node gradually rises from voltage Vthp, and asymptotically approaches a voltage lower than precharge voltage Vcc/2 of bit line pair BLi and /BLi as illustrated in FIG. 27. When H-data is written into the memory cell, the voltage on the storage node rapidly lowers from power supply voltage Vcc, and asymptotically approaches a voltage lower than precharge voltage Vcc/2 of bit line pair BLi and /BLi. Consequently, the H-data cannot be read accurately from the memory cell unless the refresh is performed at short time intervals.

However, according to memory cell MC of the planar type of the invention, the voltage on storage node P$^+$diffusion layer 15) gradually changes from the initial voltage and asymptotically approaches precharge voltage Vcc/2 of bit line pair BLi and /BLi in both the cases where H-data is written into memory cell MC, and where L-data is written into it. The time, which can elapse before the refresh, depends on whether the voltage on the storage node (P$^+$diffusion layer 15) exhibits a sufficient potential difference with respect to precharge voltage Vcc/2 on bit line pair BLi and /BLi or not. According to memory cell MC of the planar type of the invention, therefore, the interval between the refresh operations can be much longer than that of the memory cell of the conventional planar type. Thus, the number of times of the refreshing to be performed per time can be significantly reduced, and the power consumption can be significantly reduced.

Figure 22:
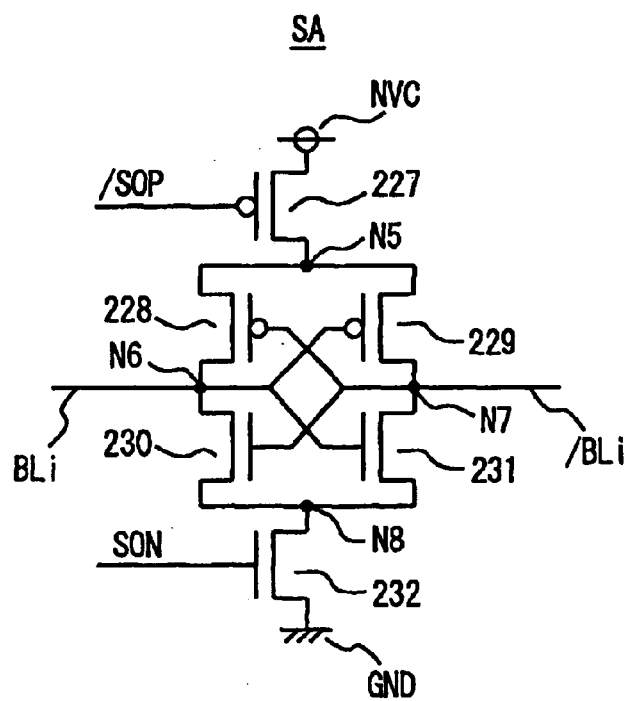
FIG. 22 is a circuit diagram of a sense amplifier.
Figure 23:
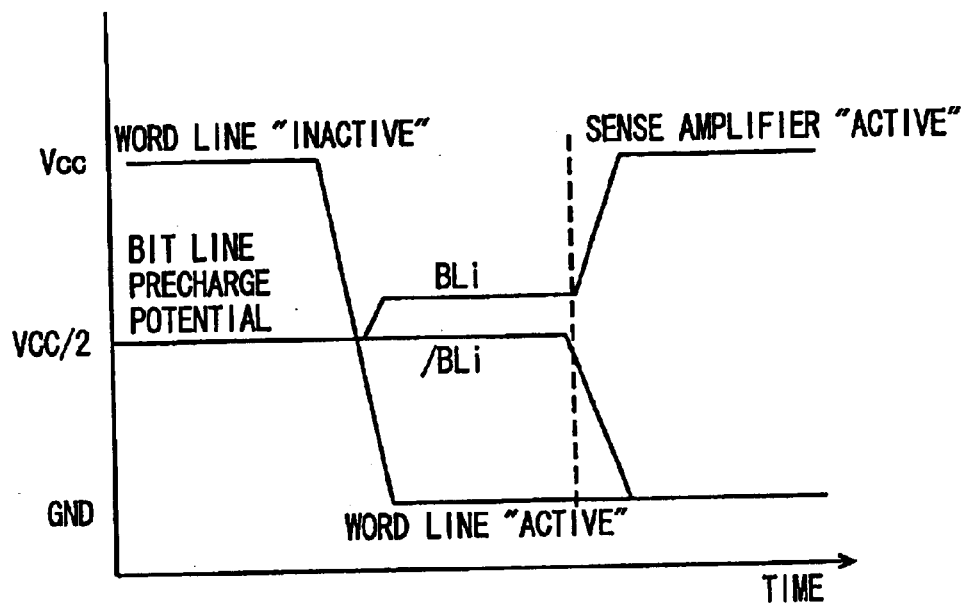
FIG. 23 is a timing chart illustrating an operation of the sense amplifier.
Figure 24:
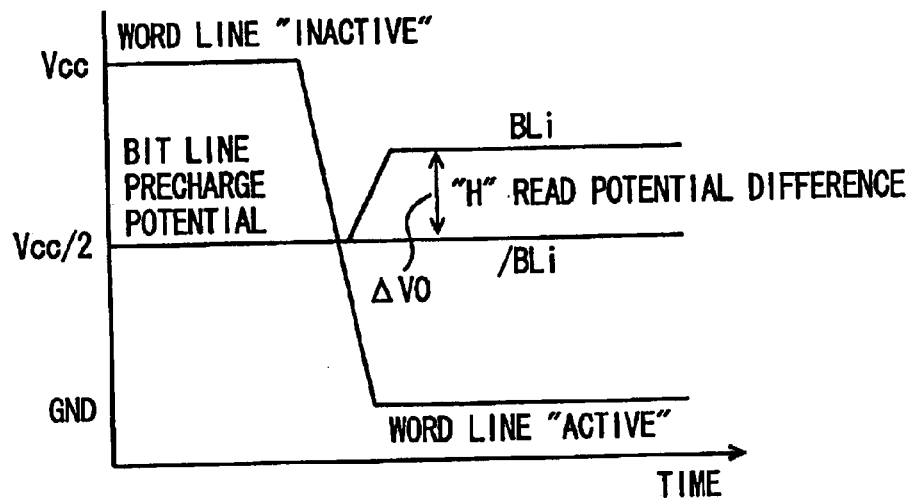
FIG. 24 illustrates a potential difference occurring when reading H-data in the memory cell of the conventional planar type.

Each of sense amplifiers 81–8m has the same circuit structure as conventional sense amplifier SA shown in FIG. 22. For reading H-data from memory cell MC and amplifying it by sense amplifier 8i (one of sense amplifiers 81–8m), potential difference ΔV0 enough to allow amplification of the read H-data by sense amplifier 8i is present between bit lines BLi and /BLi, similarly to the memory cell of the conventional planar type already described with reference to FIG. 24.

Figure 10:
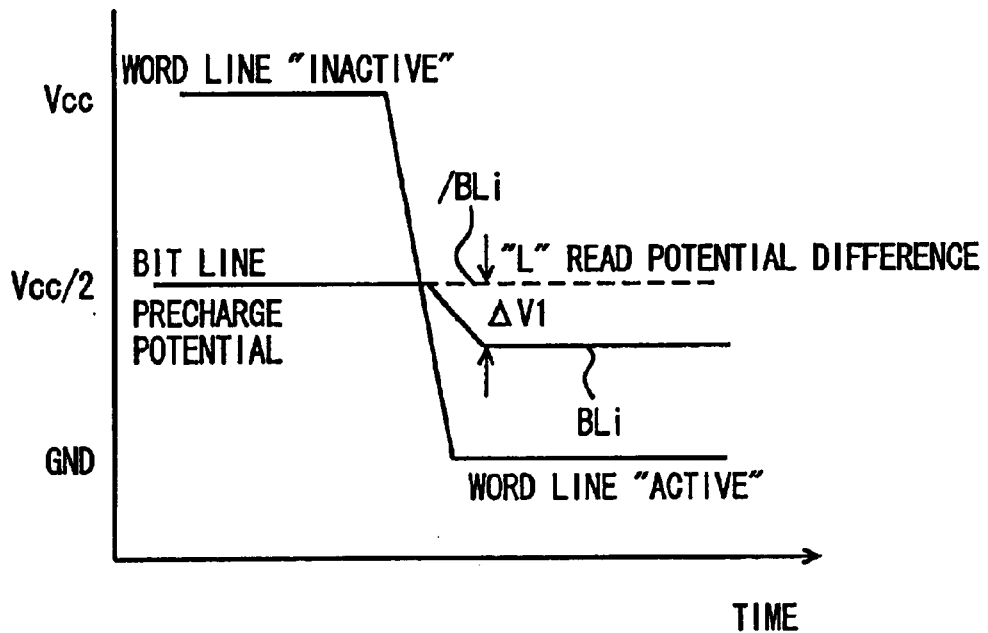
FIG. 10 illustrates a potential difference during reading of L-data.

For reading L-data from memory cell MC and amplifying it by sense amplifier 8i, a potential difference ΔV1 enough to allow amplification of the read L-data by sense amplifier 8i is present between bit lines BLi and /BLi as illustrated in FIG. 10. For reading the L-data from memory cell MC, the voltage on word line WLj lowers from power supply voltage Vcc to ground voltage GND, and word line WLj becomes active. Thereby, P-channel MOS transistor 1 of memory cell MC is turned on, and the voltage on bit line BLi lowers from precharge voltage Vcc/2 to a voltage of (Vcc/2−ΔV1). The voltage on bit line /BLi remains at precharge voltage Vcc/2. Accordingly, a potential difference of ΔV1 is present between the voltages on bit lines BLi and /BLi supplied to sense amplifier 8i. Sense amplifier 8i lowers the voltage on bit line BLi from the voltage of (Vcc/2−ΔV1) to ground voltage GND, raises the voltage on bit line /BLi from precharge voltage Vcc/2 to power supply voltage Vcc, and thereby amplifies potential difference ΔV1 between bit lines BLi and /BLi to produce a potential difference of Vcc.

As described above, memory cell MC of the planar type according to the invention holds the potential difference, which is required for amplifying the read L-data by sense amplifier 8i.

Figure 25:
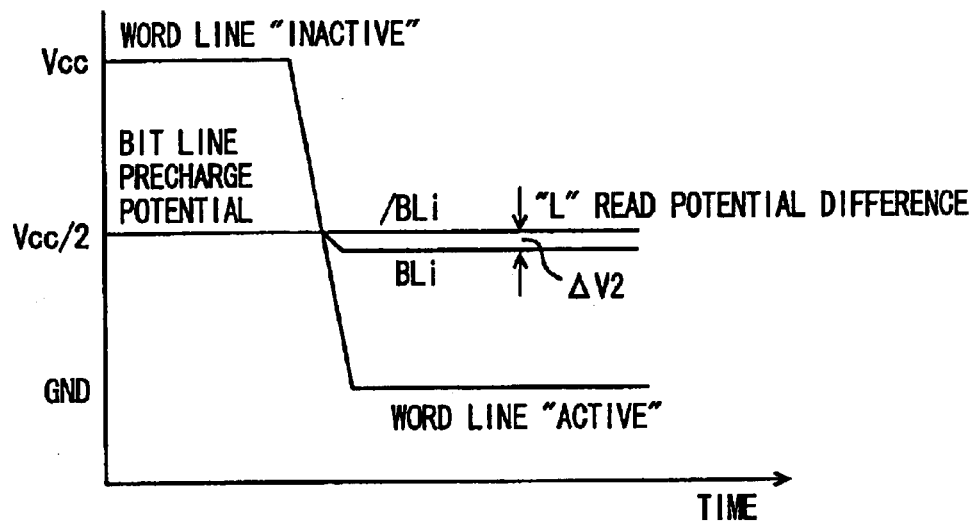
FIG. 25 illustrates a potential difference occurring when reading L-data in the memory cell of the conventional planar type.
Figure 26:
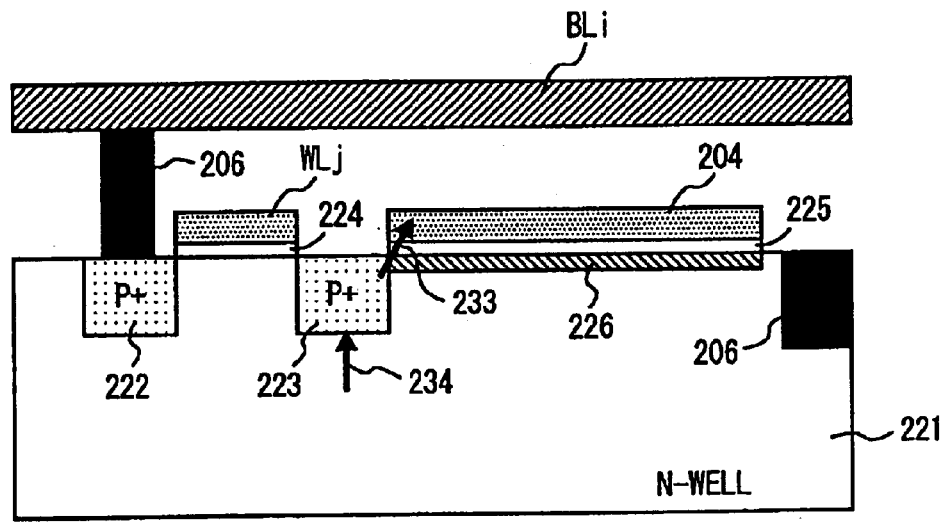
FIG. 26 is a cross section of the memory cell in the conventional planar type.

In the memory cell of the conventional planar type, since it is difficult to write sufficiently the L-data into the memory cell, a potential difference of ΔV2 is present between bit lines BLi and /BLi as illustrated in FIG. 25 when the L-data is read from the memory cell, and sense amplifier SA cannot accurately amplify such potential difference without difficulty.

According to memory cell MC of the planar type of the invention, potential difference ΔV1, which can be amplified by sense amplifier 8i, occurs between bit lines BLi and /BLi even in the operation of reading the L-data from the memory cell, as described above.

In memory cell MC of the planar type of the invention, therefore, either of H- and L-data can be sufficiently written into memory cell MC, and the potential difference enough to allow reading of the written data can be obtained. Further, the time for holding the data can be much longer than that of the memory cell of the conventional planar type so that the number of times of refreshing per time can be reduced, and the power consumption can be much reduced as compared with the memory cell of the conventional planar type.

Figure 11:
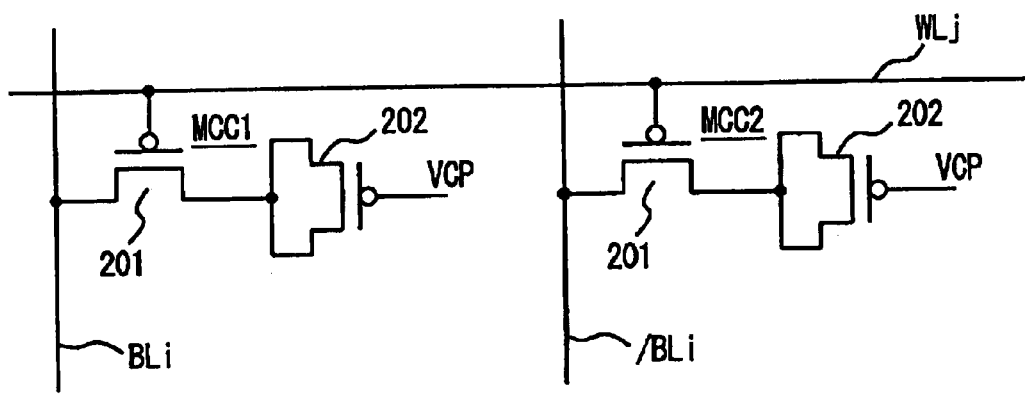
FIG. 11 is an interconnection diagram of a memory cell array of a two-cell/bit structure.
Figure 12:
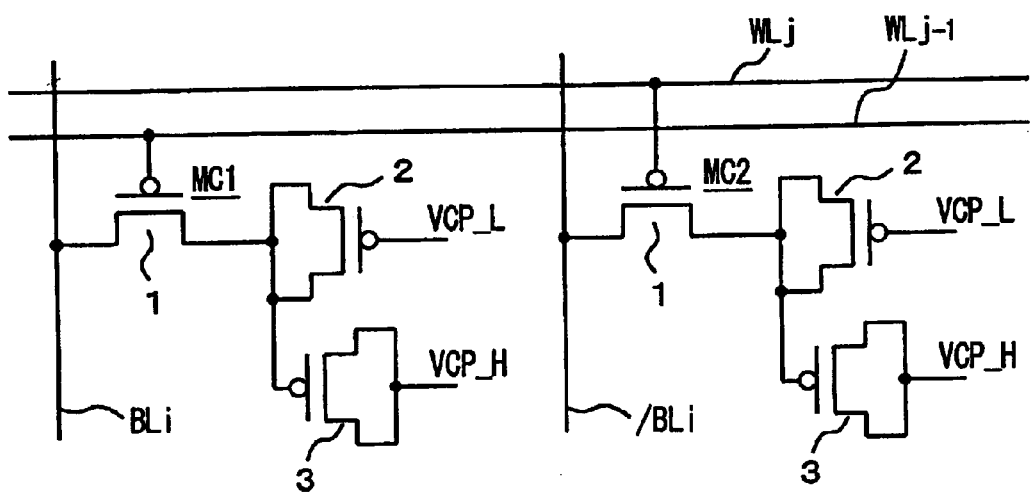
FIG. 12 is an interconnection diagram of the memory cell array shown in FIG. 1.

Referring to FIGS. 11 and 12, description will now be given on the difference between the memory cell array of the two-cell/bit structure and memory cell array 90 provided with the memory cells according to the invention.

In the memory cell array having the two-cell/bit structure, as shown in FIG. 11, two memory cells MCC1 and MCC2 each formed of P-channel MOS transistors 201 and 202 are connected to different bit lines BLi and /BLi, respectively, but are connected to the same word line WLj. Thus, two memory cells MCC1 and MCC2 are connected to word line WLj so that the data can be simultaneously supplied to and from two memory cells MCC1 and MCC2.

Conversely, according to memory cell array 90 provided with memory cells MC of the planar type of the invention, memory cells MC1 and MC2 each formed of P-channel MOS transistors 1–3 are connected to different bit lines BLi and /BLi, respectively, and are connected to different word lines WLj−1 and WLj, respectively.

In the memory cell array having the two-cell/bit structure, two transistors and two capacitors are required for representing one bit. In memory cell array 90 provided with memory cells MC according to the invention, one transistor and two capacitors are required for representing one bit.

This is a difference between memory cell array 90 provided with memory cells MC according to the invention and the memory cell array having the two-cell/bit structure.

Referring to FIG. 1 again, description will now be given on the operations of writing and reading data in semiconductor memory device 100. First, the data write operation will be described. When the data write operation starts, write enable signal /WE at L-level is supplied to semiconductor memory device 100, and control signal buffer 20 buffers write enable signal /WE at L-level and provides it to control circuit 30.

Control circuit 30 recognizes the data write mode based on write enable signal /WE at L-level sent from control signal buffer 20, and controls I/O circuit 80 to provide the write data sent from I/O terminal DQ to sense amplifiers 81–8m.

Thereafter, semiconductor memory device 100 receives row address strobe signal /RAS at L-level and addresses A0–Ak. Address buffer 10 buffers addresses A0–Ak, and provides buffered addresses A0–Ak to control circuit 30. Control signal buffer 20 buffers row address strobe signal /RAS at L-level, and provides buffered row address strobe signal /RAS at L-level to control circuit 30.

Thereby, control circuit 30 determines addresses A0–Ak received from address buffer 10 as a row address in accordance with timing of switching of row address strobe signal /RAS from H-level to L-level, and provides the row address thus determined to row decoder 40.

Thereafter, column address strobe signal /CAS at L-level and addresses A0–Ak are supplied to semiconductor memory device 100. Address buffer 10 buffers addresses A0–Ak, and provides buffered addresses A0–Ak to control circuit 30. Control signal buffer 20 buffers column address strobe signal /CAS at L-level, and provides buffered column address strobe signal /CAS at L-level to control circuit 30.

Thereby, control circuit 30 determines addresses A0–Ak received from address buffer 10 as a column address in accordance with timing of switching of column address strobe signal /CAS from H-level to L-level, and provides the column address thus determined to column decoder 70.

The write data is supplied from I/O terminal DQ to semiconductor memory device 100, and I/O circuit 80 provides the write data to sense amplifiers 81–8m.

Row decoder 40 decodes the row address, and provides the decoded row address to word line driver 50. Word line driver 50 lowers the voltage on word line WLj designated by the decoded row address from power supply voltage Vcc to ground voltage GND, and activates word line WLj.

Column decoder 70 decodes the column address, provides select signal SELi for selecting sense amplifier 8i ($1 \leq i \leq m$) designated by the decoded column address, and thereby connects sense amplifier 8i to I/O circuit 80. Sense amplifier 8i writes the write data sent from I/O circuit 80 onto bit line pair BLi and /BLi. The write data written onto bit line pair BLi and /BLi is transmitted through bit line pair BLi and /BLi, and is written into memory cell MC designated by bit line pair BLi and /BLi and word line WLj.

When the write data is H-data in the above operation, the write data is held m P-channel MOS transistor 2 of memory cell MC. When the write data is L-data, the write data is held in P-channel MOS transistor 3 of memory cell MC. Thereby, the operation of writing the data into memory cell MC ends.

The operation of reading data from the memory cell will now be described. When the data read operation starts, output enable signal /OE at L-level is supplied to semiconductor memory device 100, and control signal buffer 20 buffers output enable signal /OE at L-level, and provides buffered output enable signal /OE to control circuit 30.

Control circuit 30 operates in response to output enable signal /OE at L-level sent from control signal buffer 20, and controls 110 circuit 80 to provide the read data sent from sense amplifiers 81–8m to I/O terminal DQ.

By the same operations as those for the data writing, the row and column addresses are then provided to the row and column decoders, respectively, and word line WLj designated by the row address as well as bit line pair BLi and /BLi designated by the column address are activated.

The data is read from memory cell MC designated by activated word line WLj and activated bit line pair BLi and /BLi. Sense amplifier 8i amplifies the read data read onto bit line BLi or /BLi, and provides the amplified read data to I/O circuit 80. I/O circuit 80 provides the read data sent from sense amplifier 8i to I/O terminal DQ. Thereby, the operation of reading the data from memory cell MC ends.

According to the invention, the semiconductor memory device is merely required to include the memory cell, which includes first and second capacity elements for holding H- and L-data, respectively.

According to the first embodiment, since the semiconductor memory device is provided with the memory cell, which includes a first element holding the charges corresponding to the H-data and a second element holding the charges corresponding to the L-data. Therefore, a sufficient potential difference can be obtained between paired bit lines in both the cases where H-data is read from the memory cell, and where L-data is read therefrom.

The data holding time in the memory cell can be much longer than that in the memory cell of the conventional planar type, and the number of times of the refreshing required per time can be significantly reduced. Consequently, the power consumption can be significantly reduced.

[Second Embodiment]

Figure 13:
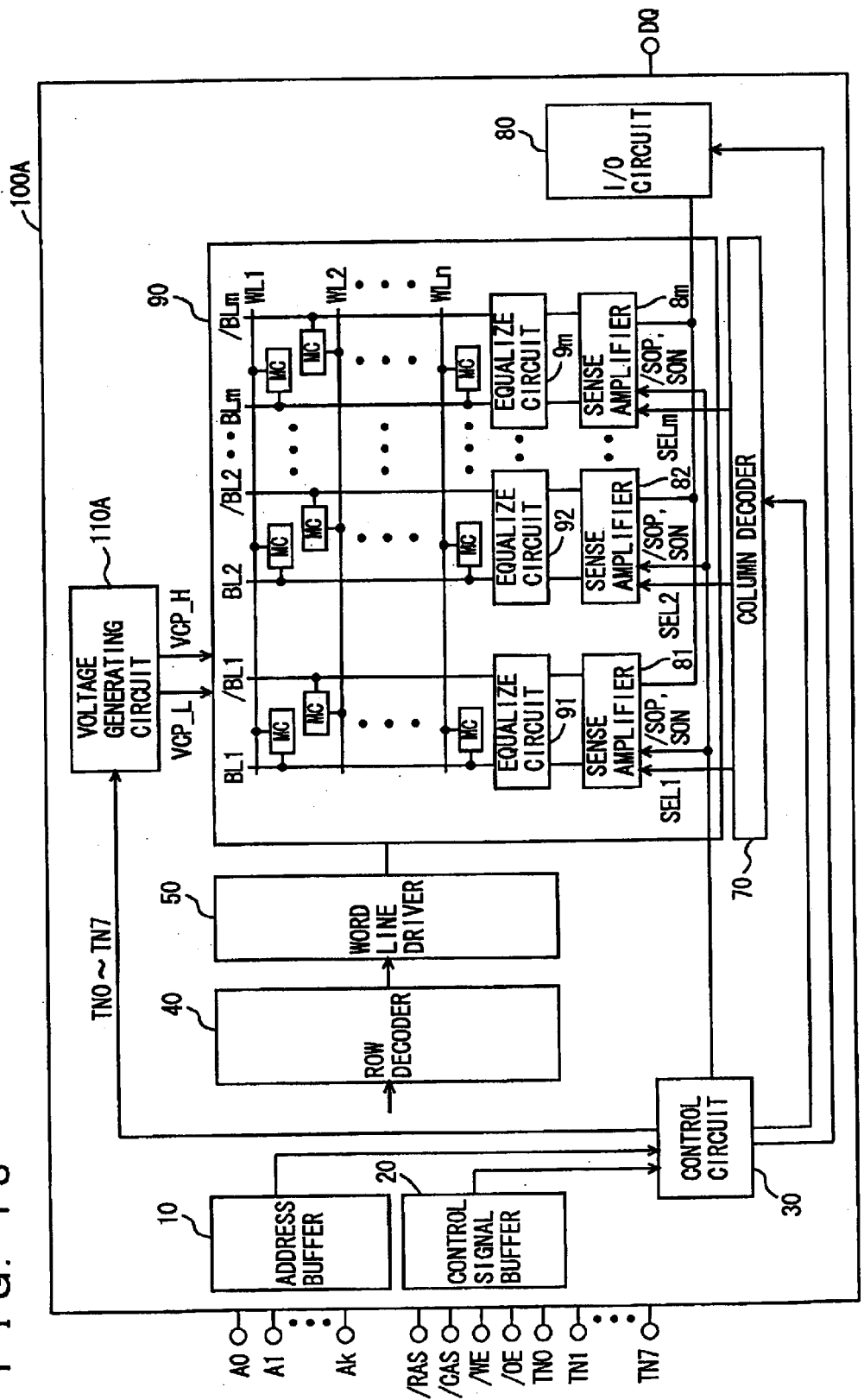
FIG. 13 is a schematic block diagram of a semiconductor memory device of a second embodiment.

Referring to FIG. 13, a semiconductor memory device 100A according to a second embodiment is the same as semiconductor memory device 100 except for that a voltage generating circuit 110 in semiconductor memory device 100 is replaced with a voltage generating circuit 110A.

In semiconductor memory device 100A, signals TN0–TN7 are supplied to semiconductor memory device 10A, and control signal buffer 20 buffers and provides signals TN0–TN7 to control circuit 30. Control circuit 30 provides signals TN0–TN7 sent from control signal buffer 20 to voltage generating circuit 110A.

Voltage generating circuit 110A generates cell plate voltages VCP_H and VCP_L at voltage levels, which are changed in accordance with the logical levels of signals TN0–TN7, and supplies cell plate voltages VCP_H and VCP_L thus generated to each memory cell MC in memory cell array 90. The data holding time is measured with various voltage levels of cell plate voltages VCP_H and VCP_L, and signals TN0–TN7 having the logic pattern, which provides the longest data holding time, is supplied to semiconductor memory device 100A.

Thereby, voltage generating circuit 110A generates cell plate voltages VHOPT1 and VLOPT2 providing the longest data holding time in accordance with signals TN0–TN7, which have the logic pattern providing the longest data holding time, and supplies cell plate voltages VHOPT1 and VLOPT2 thus generated to each memory cell MC in memory cell array 90.

Figure 14:
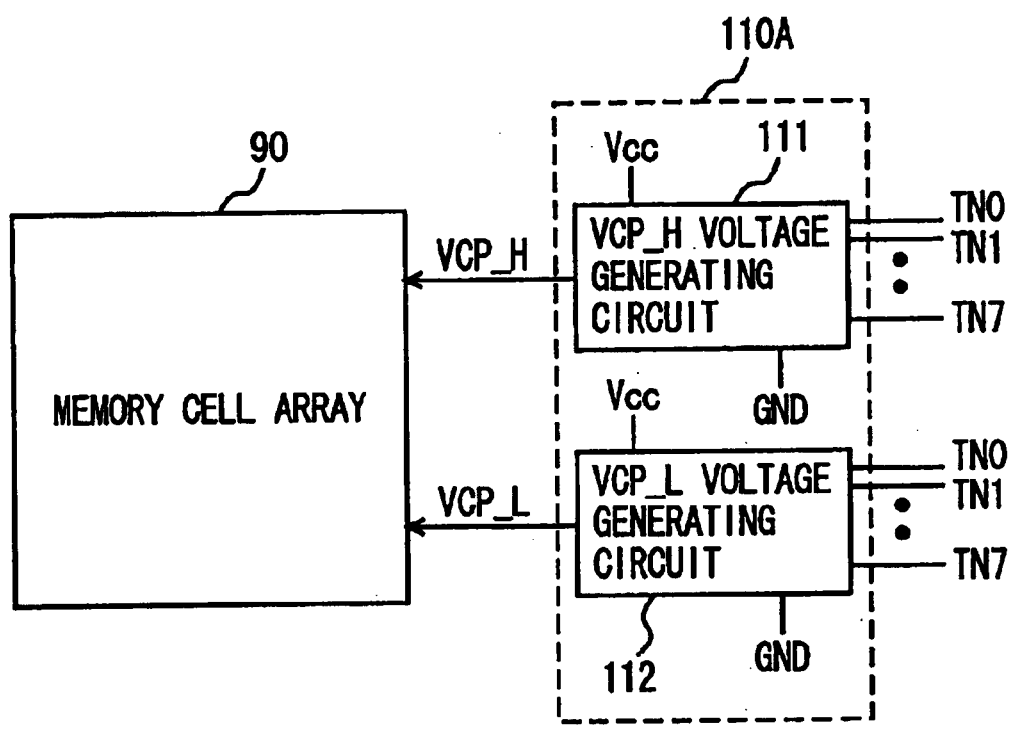
FIG. 14 is a block diagram of a voltage generating circuit shown in FIG. 13.

Referring to FIG. 14, voltage generating circuit 110A includes a VCP_H voltage generating circuit 111 and a VCP_L voltage generating circuit 112.

VCP_H voltage generating circuit 111 receives signals TN0–TN7 from control circuit 30, and generates cell plate voltage VCP_H at the voltage level corresponding to the logical levels of received signals TN0–TN7. VCP_H voltage generating circuit 111 supplies cell plate voltage VCP_H thus generated to each memory cell MC in memory cell array 90.

When VCP_H voltage generating circuit 111 receives signals TN0–TN7 having the logic pattern, which provides the longest data holding time, from control circuit 30, it generates a cell plate voltage VHOPT1 providing the longest data holding time, and supplies cell plate voltage VHOPT1 thus generated to each memory cell MC in memory cell array 90.

VCP_L voltage generating circuit 112 receives signals TN0–TN7 from control circuit 30, and generates cell plate voltage VCP_L at the voltage level corresponding to the logical levels of received signals TN0–TN7. VCP_L voltage generating circuit 112 supplies cell plate voltage VCP_L thus generated to each memory cell MC in memory cell array 90.

When VCP_L voltage generating circuit 112 receives signals TN0–TN7 having the logic pattern, which provides the longest data holding time, from control circuit 30, it generates a cell plate voltage VLOPT2 providing the longest data holding time, and supplies cell plate voltage VLOPT2 thus generated to each memory cell MC in memory cell array 90.

Figure 15:
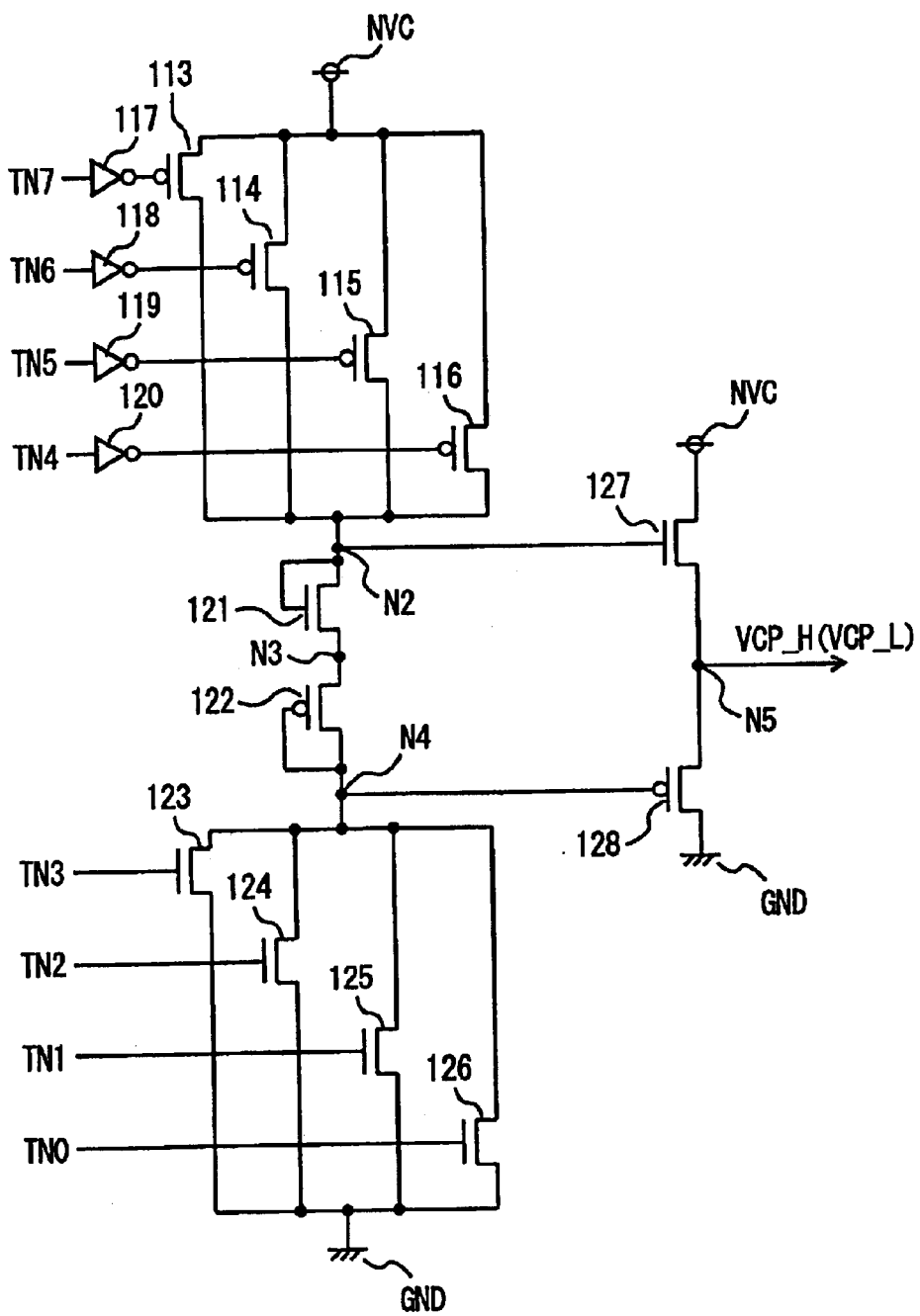
FIG. 15 is a circuit diagram showing VCP_H and VCP_L voltage generating circuits shown in FIG. 14.

Referring to FIG. 15, each of VCP_H and VCP_L voltage generating circuits 111 and 112 includes P-channel MOS transistors 113–116, 122 and 128, N-channel MOS transistors 121 and 123–127, and inverters 117–120.

P-channel MOS transistors 113–116 are connected in parallel between power supply node NVC and node N2. P-channel MOS transistor 113 receives on its gate terminal the output signal of inverter 117. P-channel MOS transistor 114 receives on its gate terminal the output signal of inverter 118. P-channel MOS transistor 115 receives on its gate terminal the output signal of inverter 119. P-channel MOS transistor 116 receives on its gate terminal the output signal of inverter 120.

Inverters 117–120 are provided corresponding to P-channel MOS transistors 113–116. Inverter 117 inverts signal TN7 sent from control circuit 30, and provides the inverted signal to the gate terminal of P-channel MOS transistor 113. Inverter 118 inverts signal TN6 sent from control circuit 30, and provides the inverted signal to the gate terminal of P-channel MOS transistor 114. Inverter 119 inverts signal TN5 sent from control circuit 30, and provides the inverted signal to the gate terminal of P-channel MOS transistor 115. Inverter 120 inverts signal TN4 sent from control circuit 30, and provides the inverted signal to the gate terminal of P-channel MOS transistor 116.

N- and P-channel MOS transistors 121 and 122 are diode-connected in series between nodes N2 and N4.

N-channel MOS transistors 123–126 are connected in parallel between node N4 and ground node GND. N-channel MOS transistor 123 receives signal TN3 sent from control circuit 30 on its gate terminal. N-channel MOS transistor 124 receives signal TN2 sent from control circuit 30 on its gate terminal. N-channel MOS transistor 125 receives signal TN1 sent from control circuit 30 on its gate terminal. N-channel MOS transistor 126 receives signal TN0 sent from control circuit 30 on its gate terminal.

N- and P-channel MOS transistors 127 and 128 are connected in series between power supply node NVC and ground node GND. N-channel MOS transistor 127 receives on its gate terminal the voltage on node N2. P-channel MOS transistor 128 receives on its gate terminal the voltage on node N4.

Assuming that P-channel MOS transistors 113–116 have channel resistance values of RP1–RP4, respectively, a relationship of (RP1>>RP2>>RP3>>RP4) is established. Assuming that N-channel MOS transistors 123–126 have channel resistance values of RN1–RN4, respectively, a relationship of (RN1>>RN2>>RN3>>RN4) is established. Channel resistance value RP1 is nearly equal to channel resistance value RN1, and channel resistance value RP2 is nearly equal to channel resistance value RN2. Channel resistance value RP3 is nearly equal to channel resistance value RN3, and channel resistance value RP4 is nearly equal to channel resistance value RN4. These channel resistance values RP1–RP4 and RN1–RN4 are much smaller than the on-resistance values of N- and P-channel MOS transistors 121 and 122.

When VCP_H voltage generating circuit 111 receives signals TN3 and TN7 at H-level as well as signals TN0–TN2 and TN4–TN6 at L-level, inverter 117 inverts signal TN7 at H-level to provide a signal at L-level to the gate terminal of P-channel MOS transistor 113, and inverter 118 inverts signal TN6 at L-level to provide a signal at H-level to the gate terminal of P-channel MOS transistor 114. Inverter 119 inverts signal TN5 at L-level to provide a signal at H-level to the gate terminal of P-channel MOS transistor 115, and inverter 120 inverts signal TN4 at L-level to provide a signal at H-level to the gate terminal of P-channel MOS transistor 116.

Thereby, P- and N-channel MOS transistors 113 and 123 are turned on, and P-channel MOS transistors 114–116 and N-channel MOS transistors 124–126 are turned off. P- and N-channel MOS transistors 113 and 123 function as channel resistances, and have channel resistance values RP1 and RN1 much larger than the on-resistances of N- and P-channel MOS transistors 121 and 122, respectively. Therefore, the voltage on node N3 is equal to a half of power supply voltage Vcc, and thus is equal to Vcc/2. Thereby, the voltage on node N2 becomes equal to (Vcc/2+Vthn), and the voltage on node N4 becomes equal to (Vcc/2−Vthp). N-channel MOS transistor 127 receives on its gate terminal the voltage of (Vcc/2+Vthn) placed on node N2, and P-channel MOS transistor 128 receives the voltage of (Vcc/2−Vthp) placed on node N4. Consequently, the voltage on node N5 becomes equal to Vcc/2. Thus, VCP_H voltage generating circuit 111 supplies cell plate voltage VCP_H formed of voltage Vcc/2 to each memory cell MC in memory cell array 90. Even when the voltage level of cell plate voltage VCP_H serving as the output voltage tends to vary, either N-channel MOS transistor 127 or P-channel MOS transistor 128 is turned on, and variations of cell plate voltage VCP_H are suppressed.

When VCP_H voltage generating circuit 111 receives signals TN3 and TN4 at H-level as well as signals TN0–TN2 and TN5–TN7 at L-level, inverter 117 inverts signal TN7 at L-level to provide a signal at H-level to the gate terminal of P-channel MOS transistor 113, and inverter 118 inverts signal TN6 at L-level to provide a signal at H-level to the gate terminal of P-channel MOS transistor 114. Also, inverter 119 inverts signal TN5 at L-level to provide a signal at H-level to the gate terminal of P-channel MOS transistor 115, and inverter 120 inverts signal TN4 at H-level to provide a signal at L-level to the gate terminal of P-channel MOS transistor 116.

P-channel MOS transistors 113–115 and N-channel MOS transistors 124–126 are turned off, and P- and N-channel MOS transistors 116 and 123 are turned on. In this case, P-channel MOS transistor 116 has the smallest resistance value RP4, and N-channel MOS transistor 123 has the largest channel resistance value RN1 so that the voltage on node N3 approaches a value of (Vcc−Vthn). Consequently, the voltage on node N5 approaches the value of (Vcc−Vthn), and VCP_H voltage generating circuit 111 supplies cell plate voltage VCP_H formed of the voltage of (Vcc−Vthn) to each memory cell MC in memory cell array 90.

As described above, VCP_H voltage generating circuit 111 generates cell plate voltage VCP_H at the voltage level, which is changed stepwise in accordance with the logic pattern of signals TN0–TN7, and cell plate voltage VCP_H thus generated is supplied to each memory cell MC in memory cell array 90.

Since cell plate voltage VCP_H is applied to the source and drain terminals of P-channel MOS transistor 3, the voltage level of cell plate voltage VCP_H must be higher than that of precharge voltage Vcc/2 of bit line pair BLi and /BLi for sufficiently holding the L-data written into memory cell MC and producing a sufficient potential difference on bit line pair BLi and /BLi in the read operation. For optimising the voltage level of cell plate voltage VCP_H, therefore, VCP_H voltage generating circuit 111 generates cell plate voltage VCP_H at the voltage level, which changes stepwise in a range between precharge voltage Vcc/2 and power supply voltage Vcc.

Thus, semiconductor memory device 100A is supplied with signals TN0–TN2 fixed at L-level, signal TN3 fixed at H-level and signals TN4–TN7 at the variable logical levels. VCP_H voltage generating circuit 111 divides power supply voltage Vcc by N-channel MOS transistor 123 and one of P-channel MOS transistors 113–116, and thereby generates cell plate voltage VCP_H at the voltage level, which is changed stepwise in a range from precharge voltage Vcc/2 to power supply voltage Vcc.

VCP_L voltage generating circuit 112 performs the same operation as VCP_H voltage generating circuit 111 already described, and thereby generates cell plate voltage VCP_L at the voltage level, which is changed stepwise in accordance with the logic pattern of signals TN0–TN7, for supplying it to each memory cell MC in memory cell array 90.

Since cell plate voltage VCP_L is applied to the gate terminal of P-channel MOS transistor 2 in memory cell MC, cell plate voltage VCP_L must be lower than precharge voltage Vcc/2 of bit line pair BLi and /BLi for sufficiently holding H-data written into memory cell MC and producing a sufficient potential difference in bit line pair BLi and /BLi in the read operation. For optimising the voltage level of cell plate voltage VCP_L, VCP_L voltage generating circuit 112 generates cell plate voltage VCP_L at the voltage level, which is changed stepwise in the range from ground voltage GND to precharge voltage Vcc/2.

Thus, semiconductor memory device 100A is supplied with signals TN4–TN6 fixed at L-level, signal TN7 at H-level and signals TN0–TN3 at variable logical levels. VCP_L voltage generating circuit 112 divides power supply voltage Vcc by P-channel MOS transistor 113 and one of N-channel MOS transistors 123–126 to generate cell plate voltage VCP_L at the voltage level, which is changed step wise in the range from ground voltage GND to precharge voltage Vcc/2.

Figure 16:
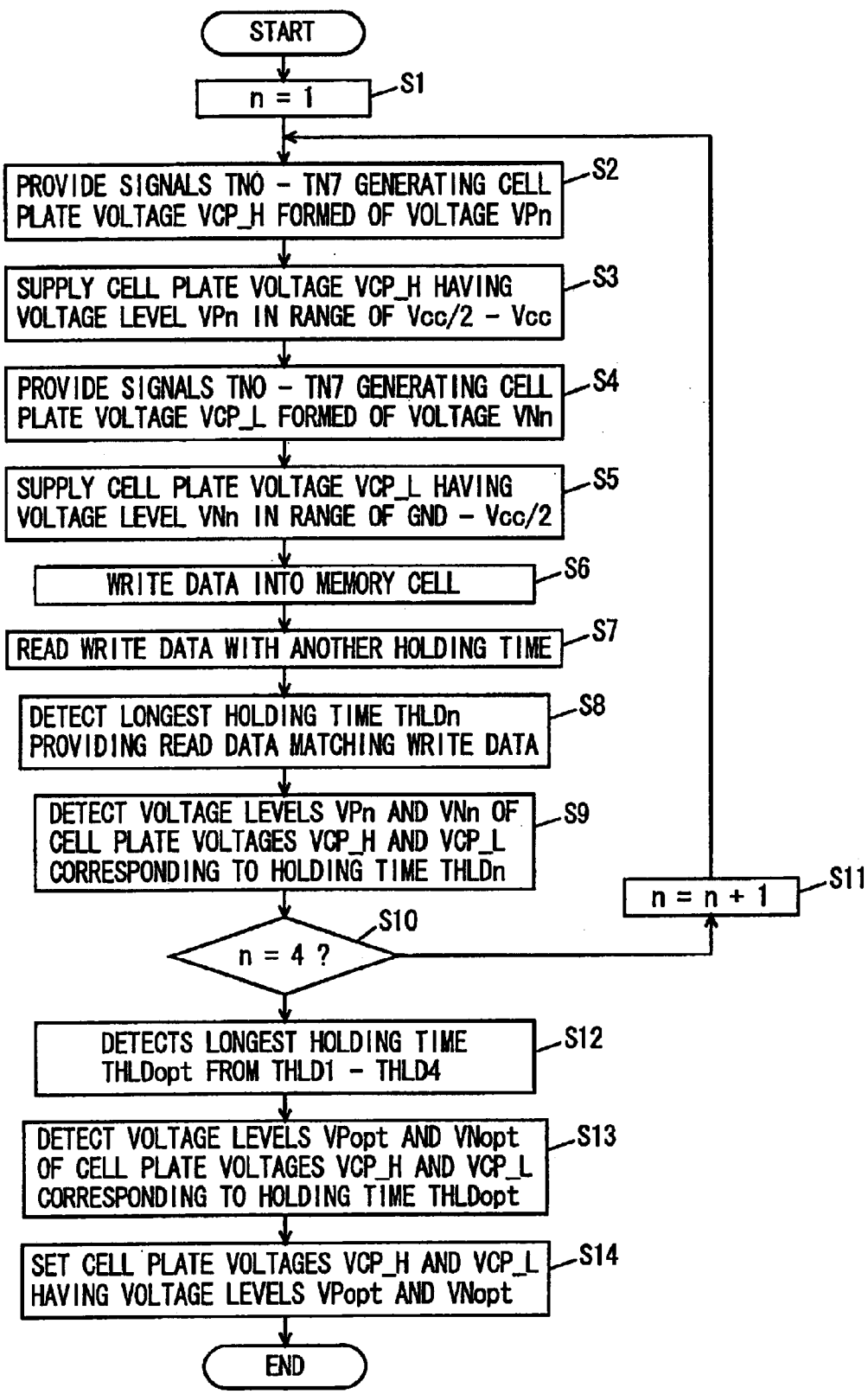
FIG. 16 is a flowchart illustrating a manner of optimizing a cell plate voltage.
Figure 17:
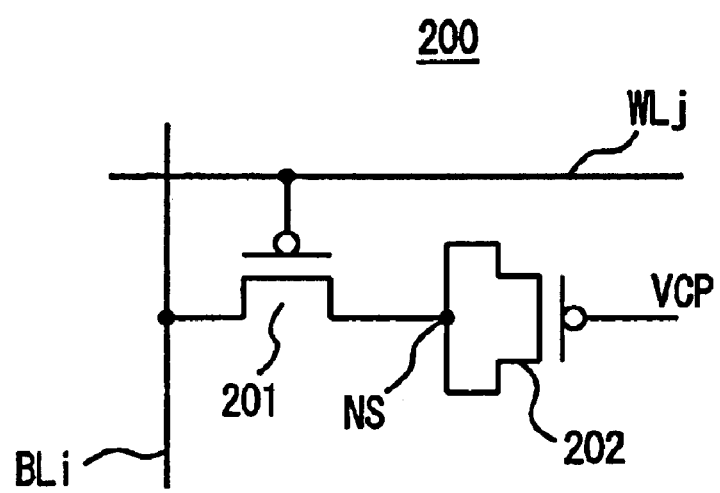
FIGS. 17 to 21 are cross sections of a memory cell of a conventional planar type, respectively.
Figure 18:
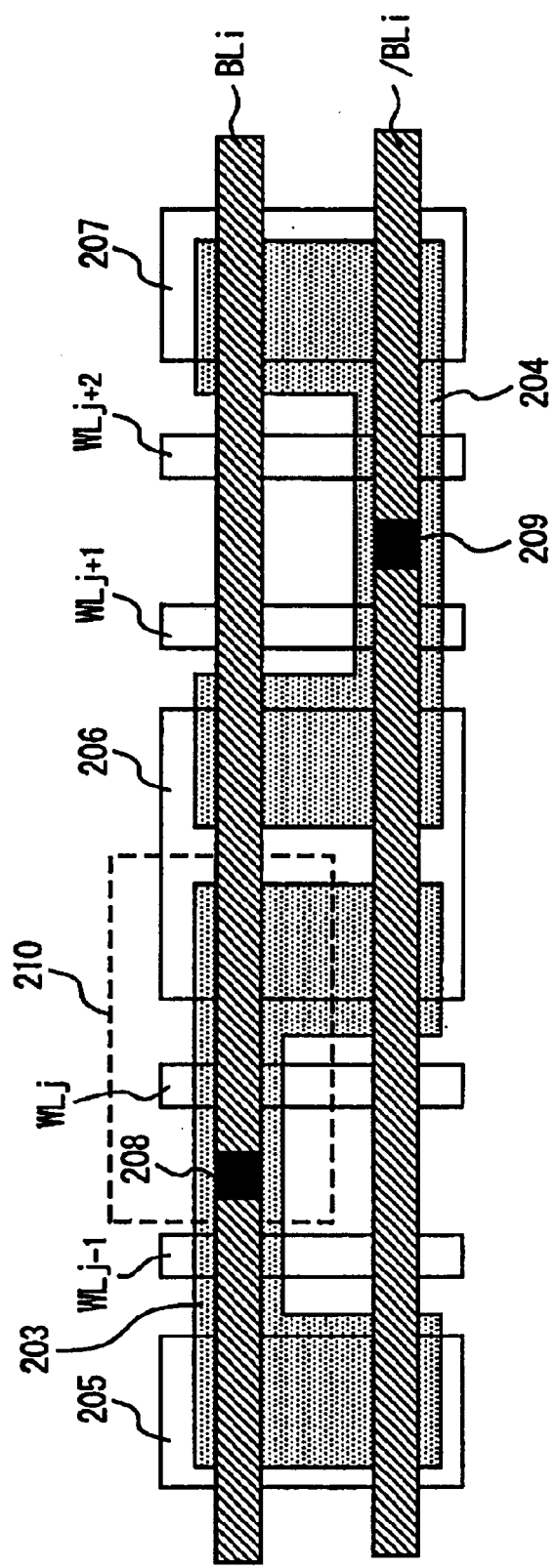
Figure 19:
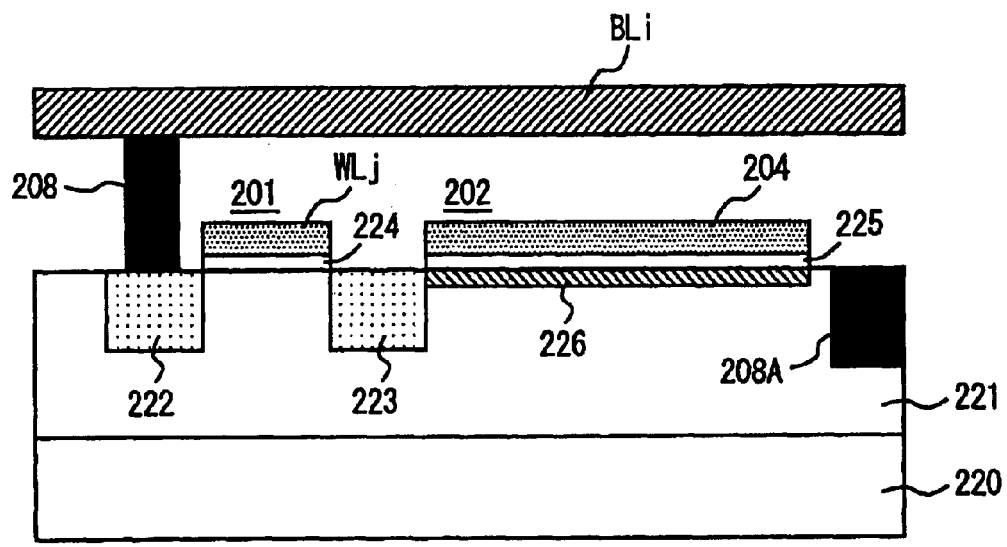
Figure 20:
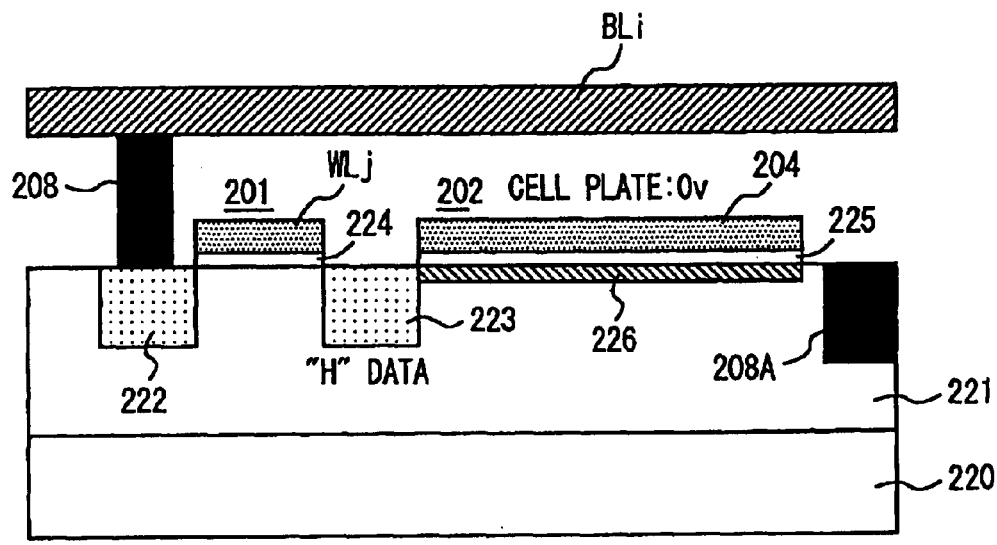
Figure 21:
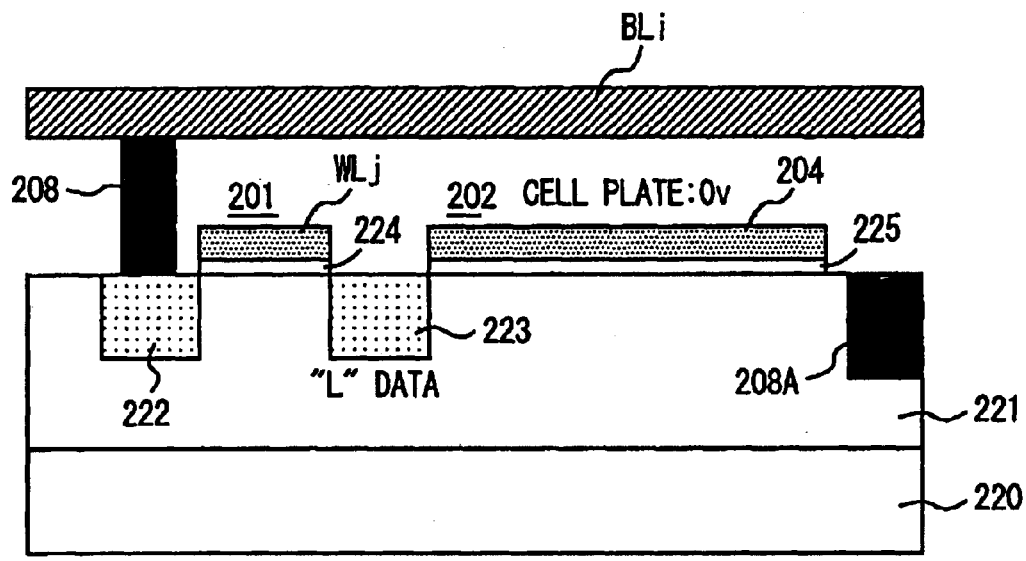

Referring to FIG. 16, description will now be given on an operation of optimising the voltage levels of cell plate voltages VCP_H and VCP_L generated by voltage generating circuit 110A.

VCP_H voltage generating circuit 111 generates cell plate voltage VCP_H, which selectively has voltage levels VP1, VP2, VP3 and VP4 (VP1>VP2>VP3>VP4) in the range between precharge voltage Vcc/2 and power supply voltage Vcc, by P-channel MOS transistors 116, 115, 114 and 113 as well as N-channel MOS transistor 123. VCP_L voltage generating circuit 112 generates cell plate voltage VCP_L, which selectively has voltage levels VN1, VN2, VN3 and VN4 (VN1>VN2>VN3>VN4) in the range between ground voltage GND and precharge voltage Vcc/2, by P-channel MOS transistor 113 and N-channel MOS transistors 123–126.

When the operation of optimizing the voltage levels of cell plate voltages VCP_H and VCP_L, one is assigned to n (n=1) in a step S1, and signals TN0–TN7 for generating cell plate voltage VCP_H formed of a voltage VPn are supplied to semiconductor memory device 100A in a step S2. More specifically, signals TN0–TN2 and TN5–TN7 at L-level as well as signals TN3 and TN4 at H-level are supplied to semiconductor memory device 100A.

Control circuit 30 provides signals TN0–TN2 and TN5–TN7 at L-level as well as signals TN3 and TN4 at H-level to VCP_H voltage generating circuit 111. In VCP_H voltage generating circuit 111, P-channel MOS transistors 113–115 and N-channel MOS transistor 124–126 are turned off, and P-channel MOS transistor 116 and N-channel MOS transistor 123 are turned on in accordance with signals TN0–TN2 and TN5–TN7 at L-level as well as signals TN3 and TN4 at H-level. VCP_H voltage generating circuit 111 generates cell plate voltage VCP_H having the highest voltage level VP1 in the range from precharge voltage Vcc/2 to power supply voltage Vcc, and supplies cell plate voltage VCP_H thus generated to each memory cell MC in memory cell array 90 (step S3).

Thereafter, signals TN0–TN7 for generating cell plate voltage VCP_L formed of a voltage VNn are supplied to semiconductor memory device 100A (step S4). More specifically, signals TN0–TN2 and TN4–TN6 at L-level as well as signals TN3 and TN7 at H-level are supplied to semiconductor memory device 100A.

Control circuit 30 provides signals TN0–TN2 and TN4–TN6 at L-level as well as signals TN3 and TN7 at H-level to VCP_L voltage generating circuit 112. In VCP_L voltage generating circuit 112, P-channel MOS transistors 114–116 and N-channel MOS transistor 124–126 are turned off, and P-channel MOS transistor 113 and N-channel MOS transistor 123 are turned on in accordance with signals TN0–TN2 and TN4–TN6 at L-level as well as signals TN3 and TN7 at H-level. VCP_L voltage generating circuit 112 generates cell plate voltage VCP_L having the highest voltage level VN1 in the range from ground voltage GND to precharge voltage Vcc/2, and supplies cell plate voltage VCP_L thus generated to each memory cell MC in memory cell array 90 (step S5).

In accordance with the operation already described in the first embodiment, the write data is written into memory cell MC (step S6). The write data is read from memory cell MC with the holding time changed to another value (step S7). Thereafter, the longest holding time THLDn, which provides the read data matching the write data, is detected (step S8), and cell plate voltages VCP_H and VCP_L corresponding to holding time THLDn are detected (step S9).

It is determined whether n is equal to four or not (step S10). If n is not equal to four, n is incremented by one (n=n+1) in a step S11. Thereafter, steps S2–S10 are repeated. Thus, VCP_H voltage generating circuit 111 generates cell plate voltage VCP_H at voltage level VP2, and supplies it to memory cell MC, and VCP_L voltage generating circuit 112 generates cell plate voltage VCP_L at voltage level VN2, and supplies it to memory cell MC. Thereby, the longest holding time THLD2 as well as voltage levels VPn and VNn of cell plate voltages VCP_H and VCP_L corresponding to holding time THLD2 are detected. Steps S2–S10 are repeated until n becomes equal to four (n=4).

When n is equal to four in step S10, the longest holding time THLDopt is detected from the longest holding times THLD1–THLD4 corresponding to respective voltage levels of cell plate voltages VCP_H and VCP_L (step S12), and voltage levels VPopt and VNopt of cell plate voltages VCP_H and VCP_L corresponding to holding time THLDopt are detected (step S13). Thereafter, semiconductor memory device 100A is supplied with signals TN0–TN7 having the logic pattern for generating cell plate voltages VCP_H and VCP_L having voltage levels VPopt and VNopt, respectively, and voltage generating circuit 110A generates cell plate voltages VHOPT1 and VLOPT2 providing the longest holding time, and supplies them to each memory cell MC in memory cell array 90 (step S14).

For example, when voltage level VPopt is equal to VP1, and voltage level VNopt is equal to VN4, semiconductor memory device 100A is supplied with signals TN0–TN2 and TN5–TN7 at L-level as well as signals TN3 and TN4 at H-level, and VCP_H voltage generating circuit 111 generates cell plate voltage VHOPT1 having voltage level VP1 by P- and N-channel MOS transistors 116 and 123 in accordance with signals TN0–TN2 and TN5–TN7 at L-level as well as signals TN3 and TN4 at H-level, and supplies it to each memory cell MC in memory cell array 90.

Then, semiconductor memory device 100A is supplied with signals TN1–TN6 at L-level as well as signals TN0 and TN7 at H-level, and VCP_L voltage generating circuit 112 generates cell plate voltage VLOPT2 having voltage level VN4 by P- and N-channel MOS transistors 113 and 126 in accordance with signals TN1–TN6 at L-level as well as signals TN0 and TN7 at H-level, and supplies it to each memory cell MC in memory cell array 90. Thereby, the operation of optimising cell plate voltages VCP_H and VCP_L ends.

When the optimized cell plate voltages VHOPT1 and VLOPT2 are determined, the logic pattern of signals TN0–TN7 for generating optimized cell plate voltages VHOPT1 and VLOPT2 is set in semiconductor memory device 100A. In practice, blowing of fuses or the like is performed to fix the logic pattern of signals TN0–TN7 for generating optimized cell plate voltages VHOPT1 and VLOPT2.

Each of VCP_H and VCP_L voltage generating circuits 111 and 112 may be deemed as a circuit, which selects one voltage from the plurality of voltages at different levels in accordance with the logical levels of signals TN0–TN7 for supplying the selected voltage to memory cells MC. Thus, VCP_H voltage generating circuit 111 generates four kinds of voltages at voltage levels, which vary stepwise in the range from precharge voltage Vcc/2 to power supply voltage Vcc, by changing the logic pattern of signals TN0–TN7, and optimized one cell plate voltage VCP is selected from the four kinds of voltages thus generated, and is supplied to each memory cell MC. VCP_L voltage generating circuit 112 operates in a similar manner.

Further, one of P-channel MOS transistors 113–116 and one of N-channel MOS transistors 123–126 form a voltage dividing circuit for dividing power supply voltage Vcc.

Structures and operations other than the above are the same as those of the first embodiment.

The first and second embodiments have been described in connection with the asynchronous DRAM. However, the invention is not restricted to this, and may be applied to synchronous DRAMs (SDRAMs) such as a DDR-SDRAM (Double Data Rate Synchronous Dynamic Random Access Memory).

According to the second embodiment, the semiconductor memory device includes the voltage generating circuit for generating the plurality of voltages at different voltage levels, from which the voltage providing the longest data holding time can be selected as the cell plate voltage. Therefore, the number of times of refreshing per time can be minimized so that the power consumption can be minimized.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a plurality of memory cells arranged in rows and columns; and
   a peripheral circuit writing data to and reading data from each of said plurality of memory cells, wherein
   each of said memory cells includes a capacitor element for storing the data, and
   said capacitor element includes first and second elements for accumulating electrical charge corresponding to first write data and second write data, respectively, the second write data being different from the first write data.

2. The semiconductor memory device according to claim 1, wherein
   said first capacitor element has a capacitance required for reading the first write data when the first write data is written, and
   said second capacitor element has a capacitance required for reading the second write data when the second write data is written.

3. The semiconductor memory device according to claim 2, wherein
   said first capacitor element is a first MOS transistor having a gate terminal fixed to a first voltage and a channel region accumulating electrical charge corresponding to the first write data, and
   said second capacitor element is a second MOS transistor having a channel region fixed to a second voltage, and accumulating electrical charge corresponding to the second write data in a gate terminal connected to the channel region of said first MOS transistor.

4. The semiconductor memory device according to claim 3, further comprising:
   a first voltage generating circuit generating the first voltage, and supplying the first voltage to the gate terminal of said first MOS transistor, and
   a second voltage generating circuit generating the second voltage, and supplying the second voltage to the channel region of said second MOS transistor.

5. The semiconductor memory device according to claim 4, wherein
   the first voltage is determined such that a first potential on the channel region of said first MOS transistor asymptotically approaches a predetermined voltage, and
   the second voltage is determined such that a second potential on the gate terminal of said second MOS transistor asymptotically approaches the predetermined voltage.

6. The semiconductor memory device according to claim 5, wherein the predetermined voltage is a precharge voltage of a bit line pair connected to one of said memory cells.

7. The semiconductor memory device according to claim 4, wherein the first voltage is a voltage providing longest time holding of electrical charge in the channel region of said first MOS transistor, and the second voltage is a voltage providing longest time holding of electrical charge in the gate terminal of said second MOS transistor.

8. The semiconductor memory device according to claim 7, wherein said first voltage generating circuit selects the first voltage from a plurality of voltages, and supplies the first voltage to the gate terminal of said first MOS transistor, and said second voltage generating circuit selects the second voltage from the plurality of voltages, and supplies the second voltage to the channel region of said second MOS transistor.

9. The semiconductor memory device according to claim 8, wherein said first voltage generating circuit includes:
  a first node supplying the first voltage to the gate terminal of said first MOS transistor,
  a first voltage dividing circuit dividing a power supply voltage to generate a plurality of first and second divided voltages, and
  a first driver generating, as said first node, a plurality of voltages corresponding to the plurality of first and second divided voltages, said first voltage dividing circuit selecting first and second specific voltages for generating the first voltage on said first node from the plurality of first and second divided voltages in response to a first command signal, and said first driver generating the first voltage on said first node in response to the first and second specific voltages;

said second voltage generating circuit includes:
  a second node supplying the second voltage to the channel region of said second MOS transistor,
  a second dividing circuit generating a plurality of third and fourth divided voltages by dividing the power supply voltage, and
  a second driver generating, on said first node, a plurality of voltages corresponding to the plurality of third and fourth divided voltages, said second voltage dividing circuit selecting third and fourth specific voltages for generating the second voltage on said second node from the plurality of third and fourth divided voltages in response to a second command signal, and said second driver generating the second voltage on said second node in response to the third and fourth specific voltages.

* * * * *